(12) United States Patent
Joshi et al.

(10) Patent No.: US 7,975,195 B1
(45) Date of Patent: Jul. 5, 2011

(54) SCAN ARCHITECTURE FOR FULL CUSTOM BLOCKS WITH IMPROVED SCAN LATCH

(75) Inventors: Kiran Joshi, Mountain View, CA (US); Manish Shrivastava, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/547,727

(22) Filed: Aug. 26, 2009

Related U.S. Application Data

(60) Provisional application No. 61/092,435, filed on Aug. 28, 2008.

(51) Int. Cl.
*G01R 31/28* (2006.01)

(52) U.S. Cl. .................. 714/727; 714/731

(58) Field of Classification Search ............. 324/73.1; 326/97, 93; 327/295; 365/189.05; 714/726, 714/727, 731
See application file for complete search history.

(56) References Cited

U.S. PATENT DOCUMENTS

| | | | |
|---|---|---|---|
| 4,862,068 A * | 8/1989 | Kawashima et al. ....... 324/73.1 |
| 5,041,742 A * | 8/1991 | Carbonaro ............... 326/97 |
| 5,568,429 A * | 10/1996 | D'Souza et al. ......... 365/189.05 |
| 5,619,511 A | 4/1997 | Sugisawa et al. |
| 6,023,179 A | 2/2000 | Klass |
| 6,434,069 B1 * | 8/2002 | Heightley et al. ........... 365/203 |
| 6,639,443 B1 * | 10/2003 | Campbell ............... 327/295 |
| 6,686,775 B2 * | 2/2004 | Campbell ............... 326/93 |
| 6,950,973 B2 * | 9/2005 | Campbell ............... 714/726 |
| 7,000,164 B2 * | 2/2006 | Siegel et al. ............ 714/731 |
| 7,487,417 B2 | 2/2009 | Branch et al. |
| 7,596,732 B2 * | 9/2009 | Branch et al. ........... 714/726 |
| 7,793,180 B1 * | 9/2010 | Shrivastava ............ 714/726 |
| 2003/0226077 A1 * | 12/2003 | Zyuban et al. ........... 714/726 |
| 2005/0138512 A1 | 6/2005 | Inuzuka et al. |

OTHER PUBLICATIONS

Office Action issued in U.S. Appl. No. 11/857,717 dated Dec. 2, 2009.
Office Action issued in U.S. Appl. No. 11/857,717 dated Jan. 15, 2010.
Notice of Allowance issued in U.S. Appl. No. 11/857,717 dated Apr. 23, 2010.
Office Action issued in U.S. Appl. No. 12/849,385 dated Oct. 20, 2010.

* cited by examiner

*Primary Examiner* — David Ton

(57) ABSTRACT

A non-fighting fully clocked scan latch is described that is dynamically configurable to support both logic data latching and scan data latching. The described scan latch circuit design reduces a load placed on a logic data latch portion of the described circuit by a scan latch portion of the described circuit, and thereby increases the speed of the described scan latch to that of an output latch without scan capability. Power required to drive the described scan latch is reduced by clocking the circuit to avoid fighting and by reducing the number of transistors included in transistor stacks internal to the scan latch. By reducing drive power requirements, eliminating internal latch fighting, and increasing latch response, a versatile scan latch is achieved that may be successfully implemented in a wide range of circuits despite the use of different supply drive voltage, threshold voltage, source-to-drain voltage, and transistor technology combinations.

20 Claims, 12 Drawing Sheets

SCAN ARCHITECTURE FOR FULL CUSTOM BLOCKS WITH IMPROVED SCAN LATCH

This application claims the benefit of U.S. Provisional Application No. 61/092,435, "Improved Scan Latch," filed by Kiran Joshi on Aug. 28, 2008, which is incorporated herein by reference in its entirety. Further, this application is related to U.S. Non-provisional application Ser. No. 11/857,717, "Scan Architecture for Full Custom Blocks" filed by Manish Shrivastava on Sep. 19, 2007, which is incorporated by reference herein in its entirety.

BACKGROUND

FIG. 1 shows an internal scan chain test structure for testing combinational logic matrices included in an integrated circuit on a semiconductor chip. In the scan chain test structure, multiplexed flip-flops MF1 102, MF2 106, MF3 108, MF4 110 and MF5 104 may receive test input data values in sequence while clocked by a scan clock signal. For example, when a first scan clock pulse is received, input terminal SI of multiplexed flip-flop MF1 102 may receive a first test input data value. When a second scan clock pulse is received, input terminal SI of second multiplexed flip-flop MF2 106 may receive the first test input data value from output terminal SO of multiplexed flip-flop MF1 102, and input terminal SI of multiplexed flip-flop MF1 102 may receive a second test input data value.

Accordingly, when a fifth scan clock pulse is received, multiplexed flip-flop MF5 104 may receive the first test input data value from output terminal SO of multiplexed flip-flop MF4 110. Meanwhile, input terminal SI of multiplexed flip-flop MF4 110 may receive the second test input data value from output SO of multiplexed flip-flop MF3 108. Input terminal SI of multiplexed flip-flop MF3 108 may receive the third test input data value from output SO of multiplexed flip-flop MF2 106. Input terminal SI of multiplexed flip-flop MF2 106 may receive the fourth test input data value from output SO of multiplexed flip-flop MF1 102. Input terminal SI of multiplexed flip-flop MF1 102 may receive the fifth test input data value.

When a pulse from the system clock is received, combinational logic 112 may receive test input data from multiplexed flip flops not shown in FIG. 1. Further, combinational logic 114 may receive the fifth test input data value from output terminal Q of multiplexed flip-flop MF1 102 and the fourth test input data value from output terminal Q of multiplexed flip-flop MF2 106, and combinational logic 116 may receive the third test input data value from output terminal Q of multiplexed flip-flop MF3 108, the second test input data value from output terminal Q of multiplexed flip-flop MF4 110, and the first test input data value from output terminal Q of multiplexed flip-flop MF5 104 so that combinational logic matrices 112, 114, 116 may be tested.

As a result of passing the test input data to the respective combinational logic matrices, test output data generated by combinational logic 112 may be output to input terminals D of multiplexed flip-flop MF1 102 and multiplexed flip-flop MF2 106, and test output data generated by combinational logic 114 may be output to input terminals D of multiplexed flips flops MF3 108, MF4 110 and MF5 104.

Therefore, when the next scan clock is activated, output terminal SO of multiplexed flip-flop MF5 104 may output a first test result, output terminal SO of multiplexed flip-flop MF4 110 may output a second test result to input terminal SI of multiplexed flip-flop MF5 104, output terminal SO of multiplexed flip-flop MF3 108 may output a third test result to input terminal SI of multiplexed flip-flop MF4 110, output terminal SO of multiplexed flip-flop MF2 106 may output a fourth test result to input terminal SI of multiplexed flip-flop MF3 108, and output terminal SO of multiplexed flip-flop MF1 102 may output a fifth test result to input terminal SI of multiplexed flip-flop MF2 106. Accordingly, in response to the fifth scan clock, output terminal SO of multiplexed flip-flop MF5 104 may output the fifth test result.

Thus, the combinational logic matrices included on an integrated circuit semiconductor chip may be tested with an internal scan chain. The above steps may be used to determine whether the combinational logic modules in the integrated circuit function normally prior to packaging the circuit for operational use.

Although the circuit described above with respect to FIG. 1 may be used to support internal scan testing of a combinational logic circuit, an internal scan chain testing based on the insertion a multiplexed flip-flop along each data line in the combinational logic circuit requires additional chip space, thereby reducing the space available for implementing functional circuits. Further, due to the complexity of a multiplexed flip-flop based approach, the chance of introducing faults within the scan chain circuitry itself is greatly increased.

SUMMARY

U.S. Non-provisional application Ser. No. 11/857,717, "Scan Architecture for Full Custom Blocks" filed by Manish Shrivastava on Sep. 19, 2007, (hereinafter referred to as Shrivastava) is incorporated by reference herein in its entirety. Shrivastava describes an approach in which output storage latches which were originally configured to support only functional processing performed by a combinational logic circuit may be adapted to support scan chain testing as well as functional processing performed by the combinational logic circuit.

For example, Shrivastava describes output storage latches within a combinational logic circuit that are adapted to further support: (1) a scan chain test preparation mode in which a sequence of test input data may be received and passed along a chain of similarly modified output storage latches in preparation for a test, (2) a scan chain test execution mode in which the loaded test data may be passed to a combinational logic for execution and the generated output results may be stored to the modified output storage latches, and (3) a scan chain test output mode in which received scan chain test results may be sequentially passed along the scan chain and output to a test result register.

As described in Shrivastava, such a dual use approach can reduce the surface area requirements for implementing scan chain testing within an integrated circuit by reducing the number of additional transistors that would otherwise be needed to support an equivalent level of scan chain testing. Further, the approach can result in a less complex circuit layout than previous approaches for implementing scan chain testing within an integrated circuit, thereby reducing the likelihood of faults and improving circuit reliability.

In addition, as described in Shrivastava, combinational logic circuits in a circuit design may be selectively modified so that circuits that support scan chain testing may be strategically placed at key locations throughout the integrated circuit design to selectively test and/or monitor the performance of the functional combinational logic circuits. The described modified circuit design, modified system of control clock signals, and modified output storage latches may be used along-side unaltered output storage latches that receive data from the same combinational logic matrix. Such flexibility allows greater flexibility with respect to the number and placement of scan chain test points within the logic circuit.

The approach described here is an alternative scan architecture for full custom blocks. A non-fighting fully clocked scan latch is described that is dynamically configurable to support both logic data latching and scan data latching. The described scan latch circuit design includes a scan latch portion that places very little load on a logic data latch portion of the described circuit, and thereby increases the speed of the described scan latch to that of an output latch without scan capability. The circuit is fully clocked to avoid fighting and reduces the number of transistors included in transistor stacks internal to the scan latch. The described alternative circuit is a versatile scan latch that may be successfully implemented in a wide range of circuits despite the use of different supply drive voltage, threshold voltage, source-to-drain voltage, and transistor technology combinations.

In a first exemplary embodiment, a scan latch is described that may include, a logic data output storage circuit that may include, a first transistor that may control a connection between a first data latch node of the logic data output storage circuit and a LOW logic signal source based on a slave phase clock signal of a two-phase clock and a second transistor that may control a connection between a second data latch node of the logic data output storage circuit and the LOW logic signal source based on a scan clock signal, a logic data pass-through switch that may control entry of a logic data from a combinational logic circuit to the first data latch node based on the slave phase clock signal, a scan data output storage circuit that may include, a first transistor that may control a connection between a first scan latch node of the scan data output storage circuit and a LOW logic signal source based on the scan clock signal, a first scan data pass-through switch that may control entry of a scan data from a scan data source to the first scan latch node based on the scan clock signal, and a second scan data pass-through switch that may control passage of the scan data from a second scan latch node to the second data latch node based on the scan clock signal.

In a second exemplary embodiment, a scan latch is described that may include, a logic data pass-through switch that may control entry of a logic data from a combinational logic circuit to a first data latch node of the scan latch based on a slave phase clock signal of a two-phase clock, and a logic data output storage circuit that may include, a first transistor that may control a first portion of a connection between the first data latch node of the logic data output storage circuit and a LOW logic signal source based on the slave phase clock signal, a second transistor that may control a first portion of a connection between a second data latch node of the logic data output storage circuit and the LOW logic signal source based on a scan clock signal, a third transistor that may control a second portion of the connection between the first data latch node of the logic data output storage circuit and the LOW logic signal source based on the slave phase clock signal and the value of the logic data passed to the first data latch node, and a fourth transistor that may control a second portion of the connection between the second data latch node of the logic data output storage circuit and the LOW logic signal source based on the scan clock signal and the value of the logic data passed to the first data latch node.

In a third exemplary embodiment, a method of controlling a scan latch is described that may include, isolating a first data latch node from a HIGH logic signal source and a LOW logic signal source based on a first clock phase of a slave phase clock signal of a two-phase clock, passing a logic data from a combinational logic circuit to the isolated first data latch node via a logic data pass-through switch based on the first clock phase of the slave phase clock signal of the two-phase clock, and maintaining the logic data stored at the first data latch node based on a second clock phase of the slave phase clock signal of the two-phase clock, a fixed value of a scan clock signal and a value of the logic data.

BRIEF DESCRIPTION OF THE DRAWINGS

Exemplary embodiments of a scan chain scan latch will be described with reference to the following drawings, wherein like numerals designate like elements, and wherein.

DETAILED DESCRIPTION OF EMBODIMENTS

Figure 2:
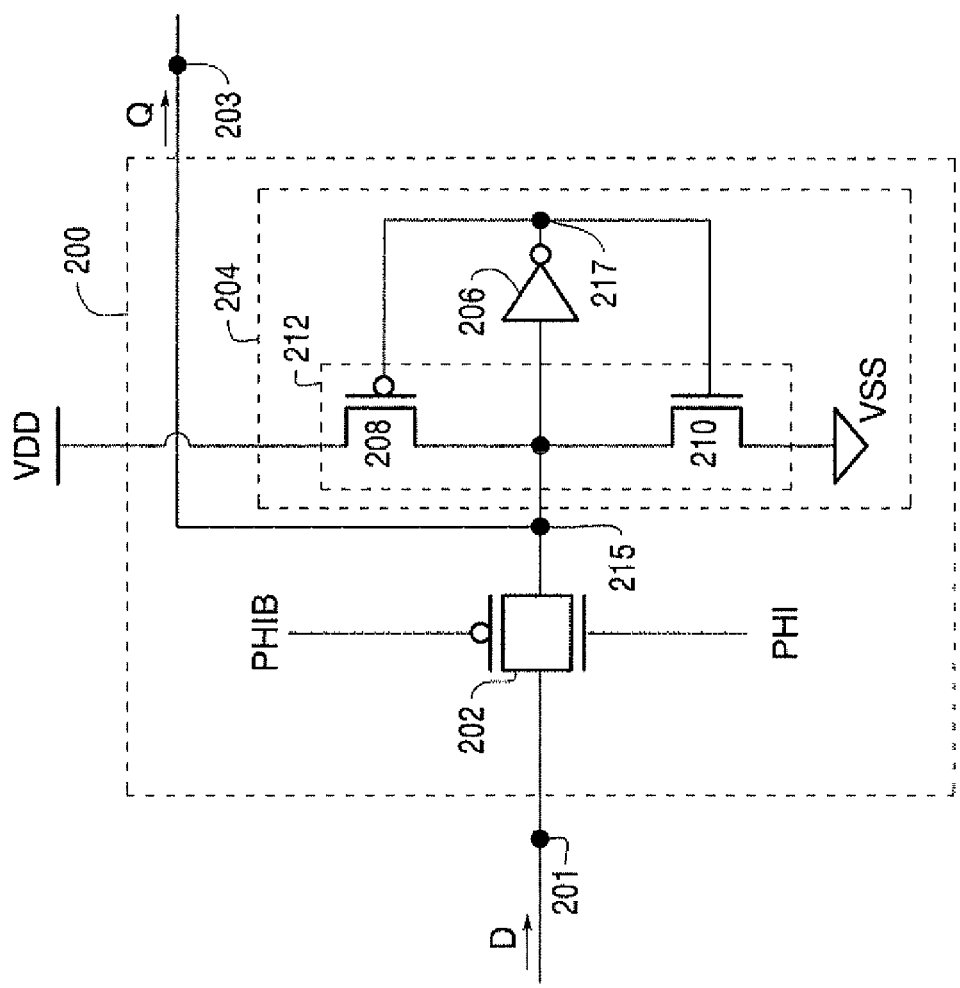
FIG. 2 shows an exemplary latch circuit.

FIG. 2 shows an exemplary latch circuit, or latch, 200. As shown in FIG. 2, latch 200, may include a pass transistor switch 202 and a storage circuit 204 that may include a feed forward inverter 206, and a feedback inverter 212, shown in FIG. 2 as including p-type transistor 208 and n-type transistor 210.

As further shown in FIG. 2, pass transistor switch 202 may include an n-type control gate, PHI, a p-type control gate, PHIB, an input gate and an output gate. The input gate of pass transistor switch 202 may be connected to a binary data signal at node 201 and an output gate of pass transistor switch 202 may be connected to node 215. One of a source and a drain of p-type transistor 208 may be connected to a HIGH voltage source, VDD, while the other of the source and the drain of p-type transistor 208 may be connected to node 215. One of a source and a drain of n-type transistor 210 may be connected to a LOW voltage source, VSS, while the other of the source and the drain of n-type transistor 210 may be connected to node 215. An input of forward feed inverter 206 may be connected to node 215, and the output of forward feed inverter 206 may be connected to both the gate of p-type transistor 208 and the gate of n-type transistor 210.

In operation, when a HIGH logic signal is received on n-type control gate, PHI, and a LOW logic signal is received on p-type control gate, PHIB, pass transistor switch 202 is closed and a binary signal data value, D, may be passed from node 201 to node 215 via CLOSED pass transistor switch 202. When a LOW logic signal is received on n-type control gate, PHI, and a HIGH logic signal is received on p-type control gate, PHIB, pass transistor switch 202 is opened, and the data value passed through pass transistor switch 202 to node 215 may be maintained by storage circuit 204, indefinitely, or until replaced with a subsequent data value received from pass transistor switch 202. The data value maintained by storage circuit 204 may be presented as a binary signal data value, Q, at node 203.

If a HIGH value is placed at node 215 the value is inverted by inverter 206 and a LOW value is placed on node 217. A LOW value on node 217 results in closing p-type transistor 208 and opening n-type transistor 210. As a result, node 215 is connected to HIGH voltage source VDD and the value at node 215 is held HIGH. Alternatively, if a LOW value is placed at node 215 the value may be inverted by inverter 206 and applied to the gates of both p-type transistor 208 and n-type transistor 210. As a result of placing a HIGH value at node 217, p-type transistor 208 opens and n-type transistor 210 closes thereby forming a direct connection between node 215 and VSS. In this manner the value at 215 may be maintained at a LOW value.

Figure 3:
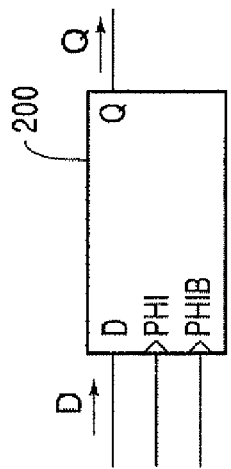
FIG. 3 shows an exemplary pin-out block representation of the latch circuit, or latch, shown in FIG. 2.

FIG. 3 shows an exemplary pin-out block representation of latch circuit 200, or latch, shown in FIG. 2. As shown in FIG. 3, the pin-out block representation of latch circuit 200 includes input pins D, PHI, PHIB and output pin Q. These input and output pins correspond with the input and output nodes described above with respect to FIG. 2. Specifically, input D represents node 201 in FIG. 2. PHI and PHIB correspond to the n-type and p-type control gates, respectively, and output Q represents node 203 in FIG. 2. Leads shown in FIG. 2 connected to HIGH voltage source, VDD, and LOW voltage source, VSS, are not shown in the pin-out block representation of latch circuit 200, by convention.

In subsequent figures described in this application, both the circuit based representation of latch 200, as shown in FIG. 2 and the pin-out block representation of latch circuit 200, as shown in FIG. 3 may be used. For example, the circuit-based representation of latch circuit 200, as shown in FIG. 2, may be used in figures in which the details of the latch are needed to facilitate comparison of the circuit with circuits described in other figures. The pin-out block representation of latch circuit 200, as shown in FIG. 3, may be used to conserve drawing space in figures in which multiple latches are shown, and the significant point being illustrated is that the latches may be formed in an array capable of receiving and/or transmitting a plurality of binary signal data values in support of a combinational logic circuit.

Figure 1:
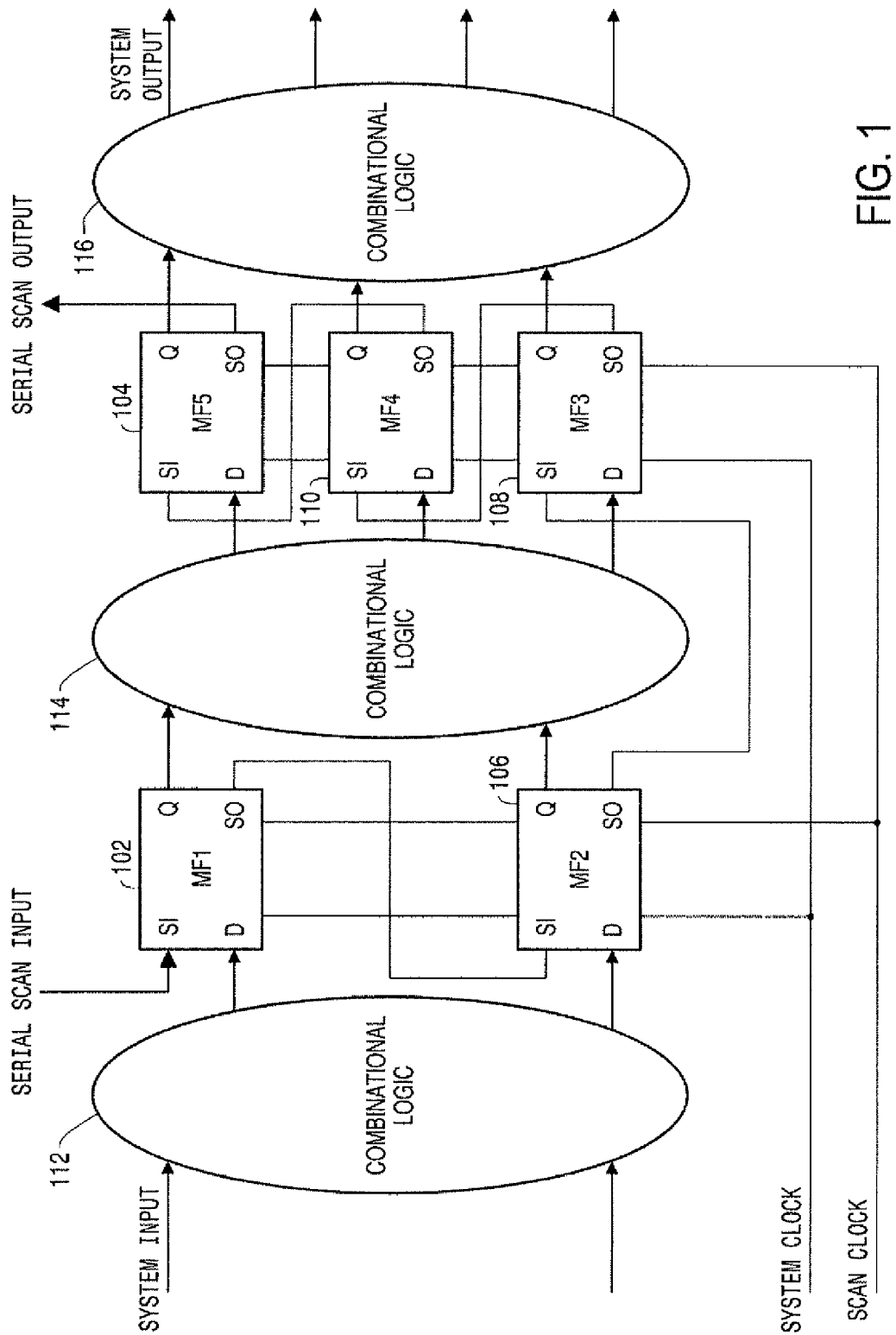
FIG. 1 shows the internal scan chain of a test chip.
Figure 4:
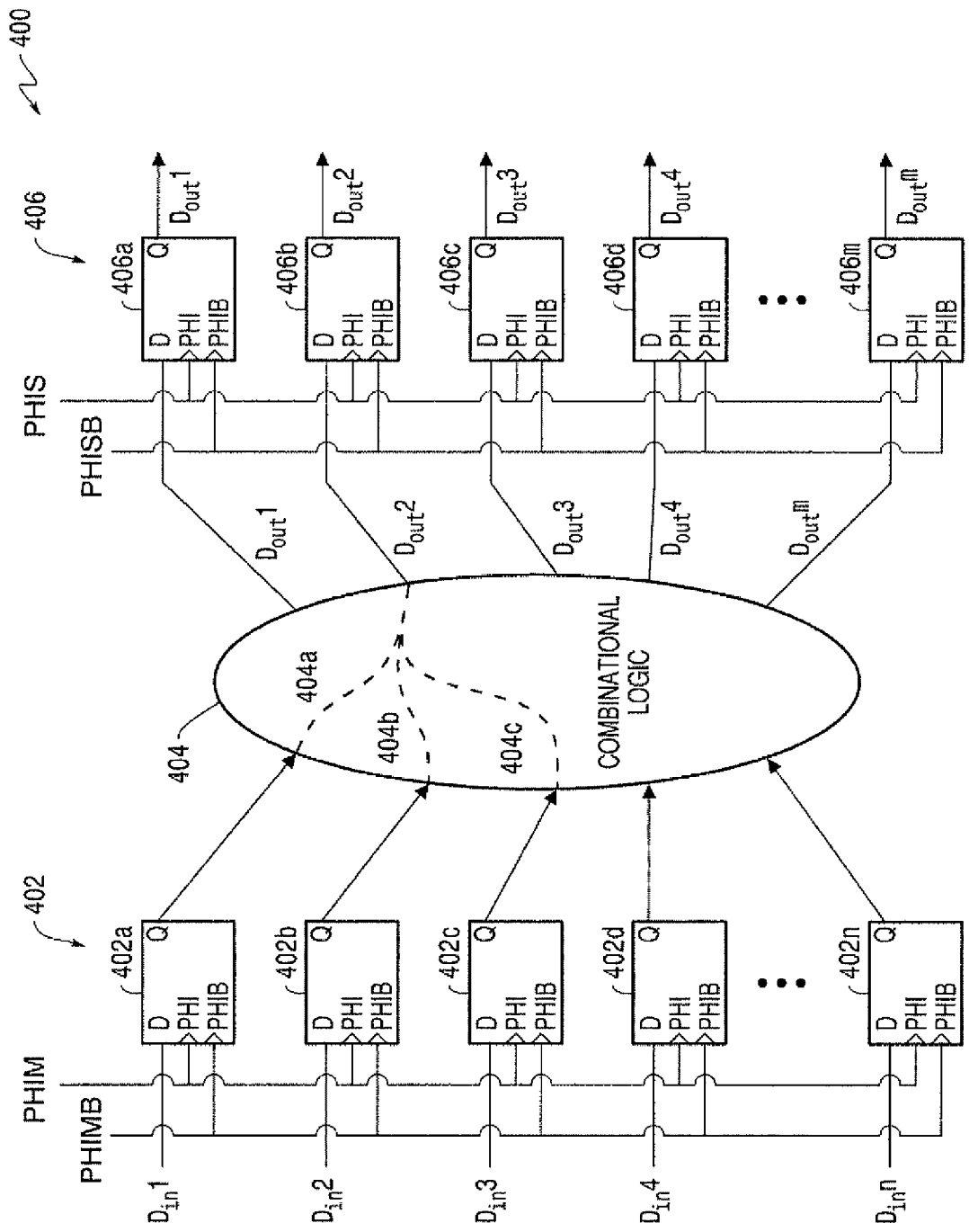
FIG. 4 shows an exemplary portion of a semiconductor integrated circuit (IC) combinational logic circuit that includes an array of master input latches, combinational logic, and an array slave output latches.

FIG. 4 is exemplary portion of a combinational logic circuit 400. Combinational logic circuit 400 may be capable of receiving input binary values, submitting the received binary values to a combinational logic matrix, and generating and indefinitely storing the output values of the combinational logic matrix. However, the circuit 400 shown in FIG. 4 does not include an internal scan chain structure for testing the combinational logic included in the circuit, such as the scan chain structure described above with respect to FIG. 1.

As shown in FIG. 4, combinational logic circuit 400 may include an array of master input latches 402, a combinational logic 404, and an array of slave output latches 406. As further shown in FIG. 4, combinational logic circuit 400 may be controlled by master phase clock signal (PHIM), inverted master phase clock signal (PHIMB), slave phase clock signal (PHIS), and inverted slave phase clock signal (PHISB). As described in Shrivastava, PHIM and PHIS may be master and slave phase clock signals of a two-phase clock generated from an external master clock EM_CLK. As such, during normal functional operations, PHIM and PHIS are never HIGH at the same time.

Master input latch array 402 may include a plurality of master input latches 402a-n, each latch within the array may be the same as latch 200 described above with respect to FIG. 2 and FIG. 3, and each latch within the array may open and close simultaneously based on the value of master phase clock signal (PHIM). For example, when PHIM is HIGH (and PHIMB is LOW), all of master input latches 402a-n may close and may allow a binary input value on each of the respective input leads $D_{in}1$ through $D_{in}n$ to pass to a corresponding input port in combinational logic 404; however, when PHIM is LOW (and PHIMB is HIGH), all of master input latches 402a-n may open, thereby isolating combinational logic 404 from each of the respective input lines $D_{in}1$ through $D_{in}n$.

Combinational logic 404 may include a plurality of interconnected logic elements, e.g., AND, NAND, OR, NOR, etc., that may be prearranged to receive binary input data values, e.g., an electrical signal that corresponds to one of a HIGH logic value, or a LOW logic value, on each of input lines $D_{in}1$ through $D_{in}n$ and to process the received input data values based on the preconfigured logic circuits contained in combinational logic 404 to produce binary output data values, e.g., an electrical signal that corresponds to one of a HIGH logic value, or a LOW logic value, on each of output lines $D_{out}1$ through $D_{out}m$.

It should be noted that, for the sake of clarity, combinational logic circuit 400 shown in FIG. 4 shows a plurality of input lines $D_{in}1$ through $D_{in}n$ to combinational logic 404, and a plurality of data output lines $D_{out}1$ through $D_{out}m$. For convenience sake, this document may refer to input lines $D_{in}1$ through $D_{in}n$ collectively, and individually, as $D_{in}x$, and may refer to output lines $D_{out}1$ through $D_{out}m$ collectively, and individually, $D_{out}x$.

Further, slave output latch array 406, may be configured as a slave output latch array such that when PHIS is LOW (and PHISB is HIGH), all of the slave output latches in the slave output latch array may be open, thereby isolating each output storage latch 408 from its respective data output line, $D_{out}x$, but when PHIS is HIGH (and PHISB is LOW), all of the slave output latches in the slave output latch array may be closed, thereby allowing binary output data on each of data output line, $D_{out}x$, to be stored on its respective output storage latch 406. However, for convenience in the description below, slave output latch array 406 may be referred to as a single latch, since, as described above, a single slave output latch 406 may be associated with each data output line, $D_{out}x$.

In operation, when master input latches 402 are closed, slave output latches 406 are open. Therefore, binary input data may pass from each of input electrodes $D_{in}x$ into combinational logic 404 to produce outputs on each of output leads $D_{out}x$. However, the value on each output lead from combinational logic 404 may not proceed to the respective slave output latches 406 to be maintained by slave output latch array 406 until (1) master phase clock signal PHIM goes LOW thereby opening the master input latches in master input latch array 402 and (2) slave clock PHIS goes HIGH thereby closing the slave output latch array 406. As soon as slave clock PHIS becomes HIGH, slave output latch array 406 may be closed and the values on each output lead from combinational logic 404 may proceed to a respective slave output latch in slave output latch array 406 to be maintained by the latch, as described above with respect to FIG. 2.

As addressed in greater detail below with respect to FIG. 12, the logical signal value presented at each node Q may be provided as an input to one of input electrodes $D_{in}x$ of the next combinational logic of the next combinational logic circuit in a chain of combinational logic circuits on the semiconductor integrated circuit. In this manner, with each full cycle of the external master clock EM_CLK, master phase clock PHIM and slave phase clock PHIS may be sequentially triggered (1) to pass data into the next phase of combinational logic and then (2) to store the output results for presentation on the next clock cycle as inputs to the next unit of combinational logic.

As described above with respect to FIG. 1, in order to verify the proper operation of the functional units of combinational logic circuits included on an integrated circuit, it may be desirable to be able to test the output of each of the combinational logic circuits included on an IC chip. Therefore, processes have been developed that allow the respective combinational units included on the IC chip to be tested. As described above with respect to FIG. 1, such an approach may be accomplished with the use of multiplexed flip-flops added to the integrated circuit at designated locations so that test input data may be scanned into the integrated circuitry on the IC chip and test output data produced as a result of passing the test input data through the respective combinational logic. The generated output data may be compared to a set of expected results to determine whether the combinational logic circuits performed correctly.

Figure 5:
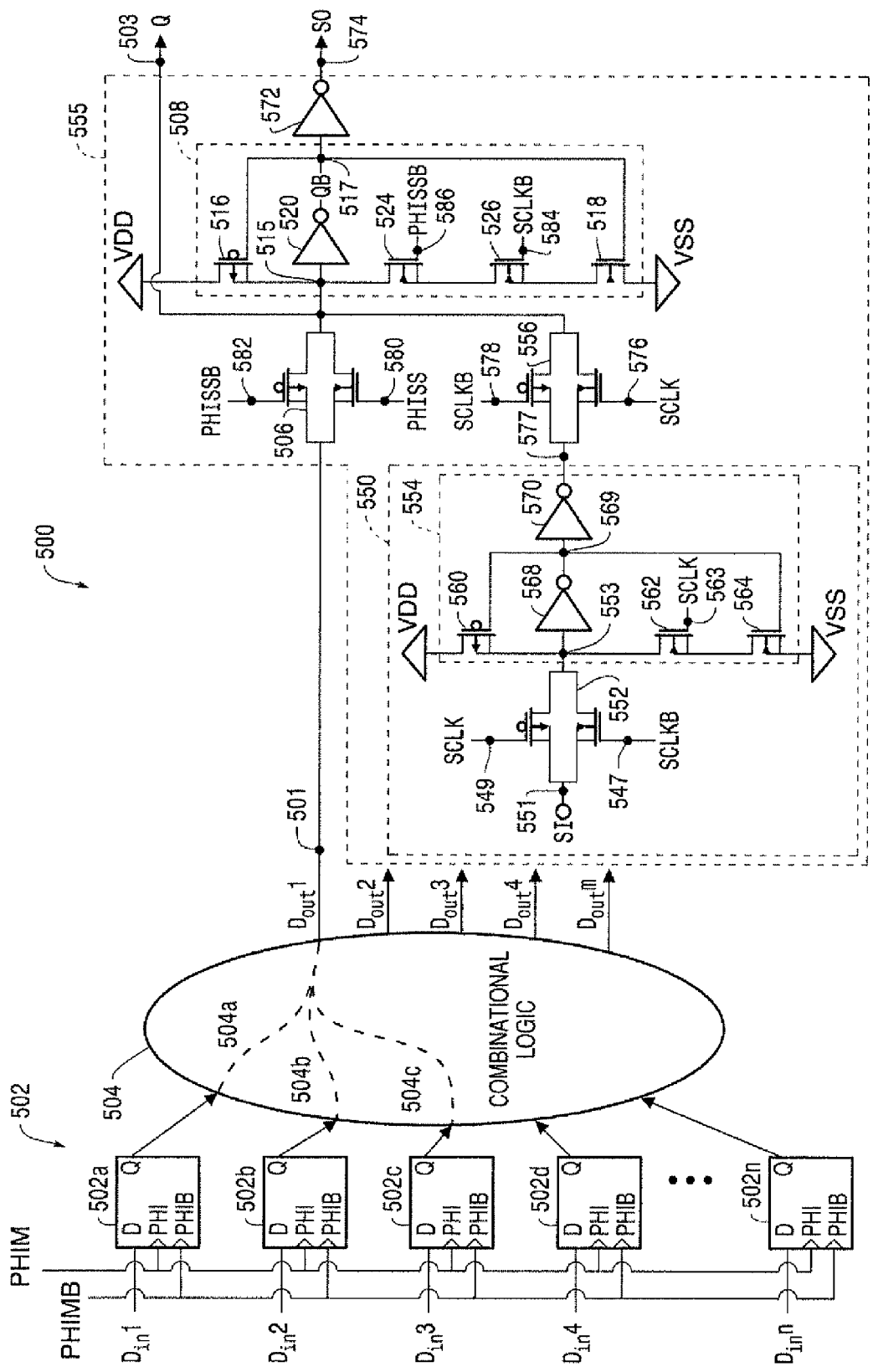
FIG. 5 shows the exemplary portion of the semiconductor integrated circuit (IC) combinational logic circuit of FIG. 4 in which the slave output latch circuit is configured for use with an internal scan chain using a related art semi-fighting scan latch.

FIG. 5 shows an exemplary portion of a combinational logic circuit, as described above with respect to FIG. 4, in which the slave output latch circuit may be adapted for use with an internal scan chain structure, using a related art scan latch previously described Shrivastava. Using a plurality of such related art scan latches to form a scan array, the combinational logic included in logic circuit 504 may be tested in a manner similar to that described above with respect to FIG. 1.

Features in FIG. 5, similar to those described earlier with respect to FIG. 4, have been identified with like numerals. For example, a feature in FIG. 5 corresponding to a like feature described with respect to FIG. 4 will be identified with a number that retains the last two digits of the numeric identifier of the object described with respect to FIG. 4. Unless otherwise indicated, the features and operational function of like numbered objects remain identical to those described above with respect to FIG. 4 and therefore are not addressed in further detail with respect to FIG. 5.

As shown in FIG. 5, the original combinational logic circuit 400, as described above with respect to FIG. 4, is modified to include a modified slave output latch circuit, or scan latch, as shown in FIG. 5 at 555, that may be used to support both normal data processing as well as scan chain based test processing. As further shown in FIG. 5, scan latch 555 may include a logic data pass-through switch 506, an output storage circuit 508, an output inverter 572, a scan control circuit 550 and a scan data pass-through switch 556.

Specifically, as shown in FIG. 5, a p-type transistor gate of logic data pass-through switch 506 may be connected to a lead fed by inverted slave phase clock signal PHISSB at node 582, and the n-type transistor gate of logic data pass-through switch 506 may be connected to a lead fed by slave phase clock signal PHISS at node 580. An input node of logic data pass-through switch 506 may be connected to an output line $D_{out}x$ of combinational logic circuit 504 at node 501 and an output node of logic data pass-through switch 506 may be connected to an input node of output storage circuit 508 at node 515. The output node of output storage circuit 508 may be connected to an input node of output inverter 572 at node 517, and an output node of output inverter 572 may maintain an output value SO of scan latch 555 at node 574. Further, an input node of scan control circuit 550 may be connected to a scan input line at node 551, an output node of scan control circuit 550 may be connected to an input node of scan data pass-through switch 556 at node 577, and an output node of scan data pass-through switch 556 may be connected to the input node of output storage circuit 508 at node 515.

Output storage circuit 508 may include a first p-type transistor 516, a forward feed inverter 520, a first n-type transistor 524, a second n-type transistor 526, and a third n-type transistor 524. An input of forward feed inverter 520 may be connected to node 515 and an output node of forward feed inverter 520 may be connected to node 517. One of a source and a drain of p-type transistor 516 may be connected to a HIGH voltage source, VDD, while the other of the source and the drain of p-type transistor 516 may be connected to node 515. First n-type transistor 524, second n-type transistor 526, and third n-type transistor 524 may be connected in series between node 515 and a LOW voltage source, VSS. For example, one of a source and a drain of n-type transistor 524 may be connected to node 515, while the other of the source and the drain of n-type transistor 524 may be connected to one of a source and a drain of n-type transistor 526. One of a source and a drain of n-type transistor 518 may be connected to one of a source and a drain of n-type transistor 526, while the other of the source and the drain of n-type transistor 518 may be connected to a LOW voltage source, VSS. The gate of p-type transistor 516 and the gate of n-type transistor 518 may be connected to node 517, the gate of n-type transistor 524 may be connected to a lead fed by inverted slave phase clock signal PHISSB at node 586, the gate of n-type transistor 526 may be connected to a lead fed by inverted scan clock signal SCLKB at node 584.

As shown in FIG. 5, scanning control circuit 550 may include a first scan pass-through switch 552, and an output storage circuit 554. A p-type transistor gate of scan data pass-through switch 552 may be connected to a lead fed by scan clock signal SCLK, and an n-type transistor gate of scan data pass-through switch 552 may be connected to a lead fed by inverted scan clock signal SCLKB. As described above, an input node of logic data pass-through switch 552 may be connected to a scan input line at node 551, an output node of logic data pass-through switch 552 may be connected to an input node of output storage circuit 554, and an output of output storage circuit 554 may be connected to an input node of scan data pass-through switch 556.

Output storage circuit 554 may include a first p-type transistor 560, a first forward feed inverter 568, a first n-type transistor 562, a second n-type transistor 564, and a second feed forward inverter 570. An input of forward feed inverter 568 may be connected to node 553 and an output node of forward feed inverter 568 may be connected to an input of forward feed inverter 570 at node 569. An output node of second forward feed inverter 570 may be connected to node 577. One of a source and a drain of p-type transistor 560 may be connected to a HIGH voltage source, VDD, while the other of the source and the drain of p-type transistor 560 may be connected to node 553. First n-type transistor 562 and second n-type transistor 564 may be connected in series between node 553 and a LOW voltage source, VSS. For example, one of a source and a drain of n-type transistor 562 may be connected to node 553, while the other of the source and the drain of n-type transistor 562 may be connected to one of a source and a drain of n-type transistor 564. The other of the source and the drain of n-type transistor 564 may be connected to a LOW voltage source, VSS. The gate of p-type transistor 560 and the gate of n-type transistor 564 may be connected to node 569. The gate of n-type transistor 562 may be connected to a lead fed by scan clock signal SCLK at node 563.

In operation during data mode, scan clock signal SCLK is held LOW and inverted scan clock signal SCLKB is held HIGH, so scan data pass-through switch 556 is fixed OPEN, and scan control circuit 550 is effectively disconnected from scan latch 555. When operating in data mode, logic data pass-through switch 506 is CLOSED, i.e., allows data to pass from node 501 to node 515, when inverted slave phase clock signal PHISSB is LOW and slave phase clock signal PHISS is HIGH. Data pass-through switch 506 is OPEN, i.e., does not allow data to pass from node 501 to node 515, when inverted slave phase clock signal PHISSB is HIGH and slave phase clock signal PHISS is LOW.

During operation, the value of a data bit allowed to pass from node 501 to node 515 by data pass-through switch 506 is maintained by storage circuit 508 at node 515, and an inverted value of the received bit is maintained by storage circuit 508 at node 517. As a result, a HIGH or LOW value corresponding to the LOW or HIGH value maintained at node 515 is maintained by inverter 520 at node 517.

So long as n-type transistor 524 and n-type transistor 526 are both closed, storage circuit 508 performs in the same manner described above with respect to feedback inverter 212 in FIG. 2. However, if any one or both of n-type transistor 524 and n-type transistor 526 are open, the connection between node 515 and VSS is broken. Since the gate of n-type transistor 524 and the p-type transistor on logic data pass-through switch 506 are both connected to inverted slave phase clock signal PHISSB, n-type transistor 524 will always be open when data is passed into storage circuit 508. Further, since the gate of n-type transistor 526 and the p-type transistor on scan data pass-through switch 556 are both connected to inverted scan clock signal SCLKB, n-type transistor 526 will always be open when scan data is passed into storage circuit 508. As a result, SFFLAT 555 may be controlled by inverted scan slave phase clock signal PHISSB and inverted scan clock signal SCLKB to serve as a semi-fighting latch in both data mode and scan mode, i.e., the latch is non-fighting for a change LOW to HIGH at node 515 and fighting for a change of HIGH to LOW at note 515.

For example, for a change from HIGH to LOW at node 515, p-type transistor 516, shown in FIG. 5, is initially is a CLOSED state, forming a connection between node 515 and HIGH voltage source VDD that maintains the HIGH value at node 515. In order to replace a previously stored HIGH value in the latch node Q, i.e., at node 515, with a LOW value, the output of combinational logic circuit 504 at node 501 must be strong enough to pull node 515 LOW long enough to cause inverter 520 to store a LOW value at node 517 so that p-type transistor 516 is OPENED. In other words, combinational logic circuit 504 is required to fight with p-type transistor 516 to affect the change from HIGH to LOW. However, for a change from LOW to HIGH at node 515, feedback p-type transistor 516 is OPEN thereby disconnecting node 515 from HIGH voltage source VDD, and n-type transistor 524 is also OPEN, since n-type transistor 524, controlled by PHISSB, is always OPEN when logic data pass-through switch 506, which includes a p-type transistor also controlled by PHISSB, is CLOSED. Therefore, the output of combinational logic circuit 504 at node 501 may change a LOW value at node 515 to a HIGH value without fighting against another transistor.

In operation during scan mode, inverted slave phase clock signal PHISSB is held HIGH and slave phase clock signal PHISS is held LOW, so logic data pass-through switch 506 is fixed OPEN, and combination logic circuit 504 is effectively disconnected from scan latch 555. When operating in scan mode, scan data pass-through switch 552 is CLOSED, i.e., allows data to pass from node 551 to node 553, when scan clock signal SCLK is LOW and inverted scan clock signal SCLKB is HIGH. Scan data pass-through switch 552 is OPEN, i.e., does not allow data to pass from node 551 to node 553, when scan clock signal SCLK is HIGH and inverted scan clock signal SCLKB is LOW.

During operation, the value of a data bit allowed to pass from node 551 to node 553 by scan data pass-through switch 552 is maintained at node 553, and an inverted value of the received bit is maintained by inverter 568 at node 569. As a result, a HIGH or LOW value corresponding to the LOW or HIGH value maintained at node 569 is maintained by inverter 570 at node 577.

So long as n-type transistor 562 is closed, storage circuit 554 performs in the same manner described above with respect to feedback inverter 212 in FIG. 2. However, if n-type transistor 562 is open, the connection between node 553 and VSS is broken. Since the gate of n-type transistor 562 is connected to scan clock signal SCLK, n-type transistor 562 will always be open when data is passed into storage circuit 554. As a result, storage circuit 554 in scan control circuit 550 may be controlled by scan clock signal SCLK to serve as a semi-fighting latch during scan mode, i.e., the latch is non-fighting for a change LOW to HIGH at node 553 and fighting for a change of HIGH to LOW at note 553.

Figure 6:
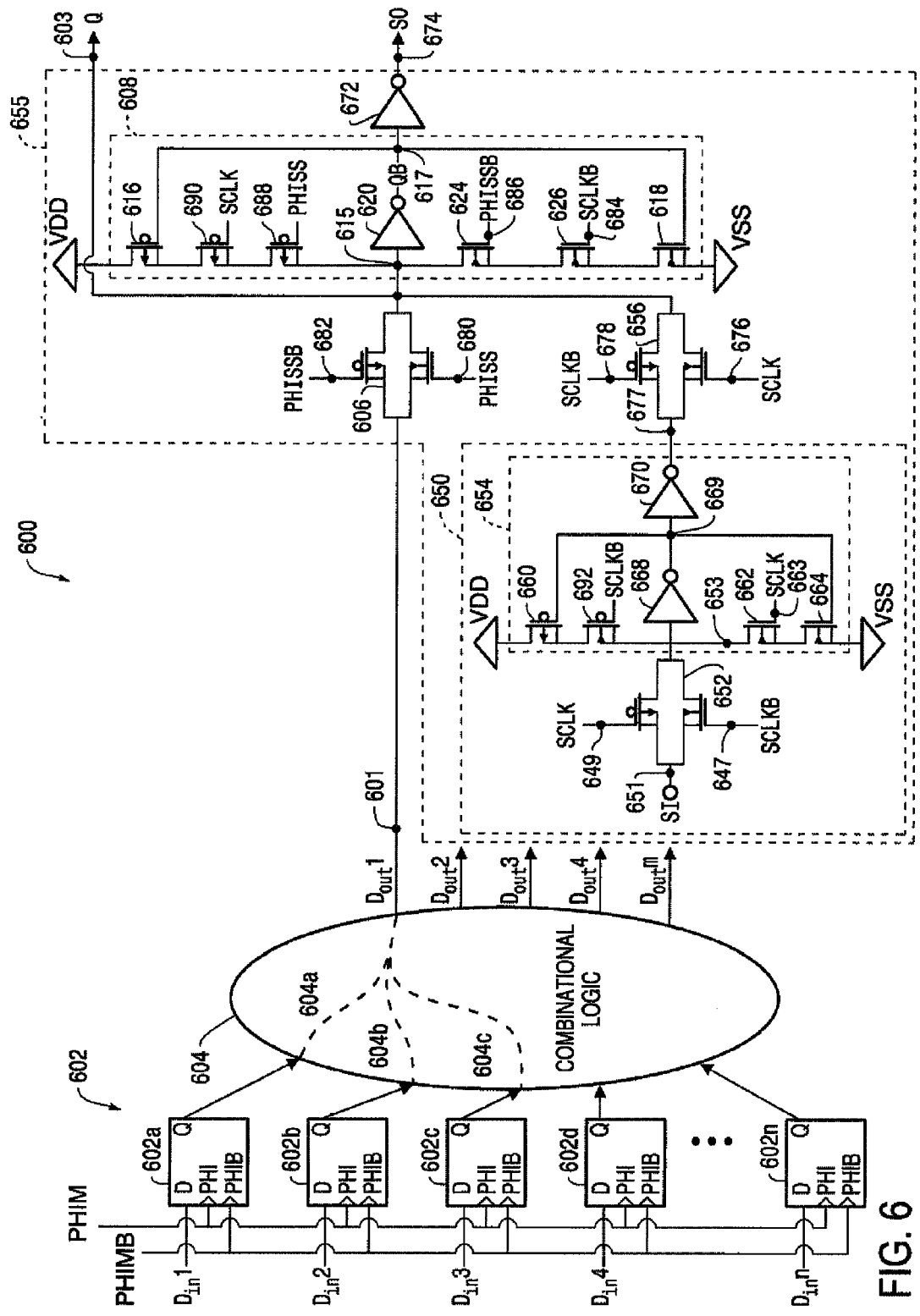
FIG. 6 shows the exemplary portion of the semiconductor integrated circuit (IC) combinational logic circuit of FIG. 4 in which the slave output latch circuit is configured for use with an internal scan chain using a first embodiment of a fully clocked non-fighting scan latch.

FIG. 6 shows an exemplary portion of a combinational logic circuit, as described above with respect to FIG. 5, in which the semi-fighting slave output scan latch 555 of FIG. 5 has been modified to become a non-fighting slave output scan latch 655. Using a plurality of such non-fighting slave output scan latches to form a scan array, the combinational logic included in logic circuit 604 may be tested in a manner similar to that described above with respect to FIG. 1.

Features in FIG. 6, similar to those described earlier with respect to FIG. 5, have been identified with like numerals. For example, a feature in FIG. 6 corresponding to a like feature described with respect to FIG. 5 will be identified with a number that retains the last two digits of the numeric identifier of the object described with respect to FIG. 5. Unless otherwise indicated, the features and operational function of like numbered objects remain identical to those described above with respect to FIG. 5 and therefore are not addressed in further detail with respect to FIG. 6.

In one example embodiment of a non-fighting slave output scan latch 655, as shown in FIG. 6, output storage circuit 608 may modified to include p-type transistor 690 and p-type transistor 688 and output storage circuit 654 may modified to include p-type transistor 692. For example, p-type transistor 690 and p-type transistor 688 may be connected in series with one of a source and a drain of p-type transistor 690 connected to one of a source and a drain of p-type transistor 616, the other one of the source and drain of p-type transistor 690 connected to one of a source and a drain of p-type transistor 688, and the other one of the source and drain of p-type transistor 688 connected to node 615. The gate of p-type transistor 690 may be connected to a lead fed by scan clock signal SCLK, and the gate of p-type transistor 688 may be connected to a lead fed by slave phase clock signal PHISS. Further, one of a source and a drain of p-type transistor 692 may be connected to one of a source and a drain of p-type transistor 660, the other one of the source and drain of p-type transistor 692 may be connected to node 653. The gate of p-type transistor 692 may be connected to a lead fed by inverted scan clock signal SCLKB.

In operation during data mode scan clock signal SCLK is held LOW and inverted scan clock signal SCLKB is held HIGH, so scan data pass-through switch 656 is fixed OPEN, and scan control circuit 650 is effectively disconnected from non-fighting slave output scan latch 655. When operating in data mode, logic data pass-through switch 606 is CLOSED, i.e., allows data to pass from node 601 to node 615, when inverted slave phase clock signal PHISSB is LOW and slave phase clock signal PHISS is HIGH. Data pass-through switch 606 is OPEN, i.e., does not allow data to pass from node 601 to node 615, when inverted slave phase clock signal PHISSB is HIGH and slave phase clock signal PHISS is LOW.

During operation, the value of a data bit allowed to pass from node 601 to node 615 by data pass-through switch 606 is maintained by storage circuit 608 at node 615, and an inverted value of the received bit is maintained by storage circuit 608 at node 617. As a result, a HIGH or LOW value corresponding to the LOW or HIGH value maintained at node 615 is maintained by inverter 620 at node 617.

So long as p-type transistor 690 and p-type transistor 688 are both closed, storage circuit 608 performs in the same manner described above with respect to output storage circuit 508 in FIG. 5. However, if any one or both of p-type transistor 690 and p-type transistor 688 are open, the connection between node 615 and VDD is broken. Since the gate of p-type transistor 688 and the n-type transistor on logic data pass-through switch 606 are both connected to slave phase clock signal PHISS, p-type transistor 688 will always be open when data is passed into storage circuit 608. Further, since the gate of p-type transistor 690 and the n-type transistor on scan data pass-through switch 656 are both connected to scan clock signal SCLK, p-type transistor 690 will always be open when scan data is passed into storage circuit 608. As a result, storage circuit 608 may be controlled by scan slave phase clock signal PHISS, scan clock signal SCLK, inverted scan slave phase clock signal PHISSB and inverted scan clock signal SCLKB, to serve as a non-fighting latch in both data mode and scan mode, i.e., the latch is non-fighting for a change LOW to HIGH at node 615 and non-fighting for a change of HIGH to LOW at note 615.

In operation during scan mode, inverted slave phase clock signal PHISSB is held HIGH and slave phase clock signal PHISS is held LOW, so logic data pass-through switch 606 is fixed OPEN, and combination logic circuit 604 is effectively disconnected from non-fighting slave output scan latch 655. When operating in scan mode, scan data pass-through switch 652 is CLOSED, i.e., allows data to pass from node 651 to node 653, when scan clock signal SCLK is LOW and inverted scan clock signal SCLKB is HIGH. Scan data pass-through switch 652 is OPEN, i.e., does not allow data to pass from node 651 to node 653, when scan clock signal SCLK is HIGH and inverted scan clock signal SCLKB is LOW.

During operation, the value of a data bit allowed to pass from node 651 to node 653 by scan data pass-through switch 652 is maintained at node 653, and an inverted value of the received bit is maintained by inverter 668 at node 669. As a result, a HIGH or LOW value corresponding to the LOW or HIGH value maintained at node 669 is maintained by inverter 670 at node 677.

So long as p-type transistor 692 is closed, storage circuit 654 performs in the same manner described above with respect to output storage circuit 554 described above with respect to FIG. 5. However, if p-type transistor 692 is open, the connection between node 653 and VDD is broken. Since the gate of p-type transistor 692 is connected to inverted scan clock signal SCLKB, p-type transistor 692 will always be open when data is passed into storage circuit 654. As a result, storage circuit 654 in scan control circuit 650 may be controlled by inverted scan clock signal SCLKB and scan clock signal SCLK to serve as a non-fighting latch during scan mode, i.e., the latch is non-fighting for a change LOW to HIGH at node 653 and non-fighting for a change of HIGH to LOW at note 653.

Figure 7:
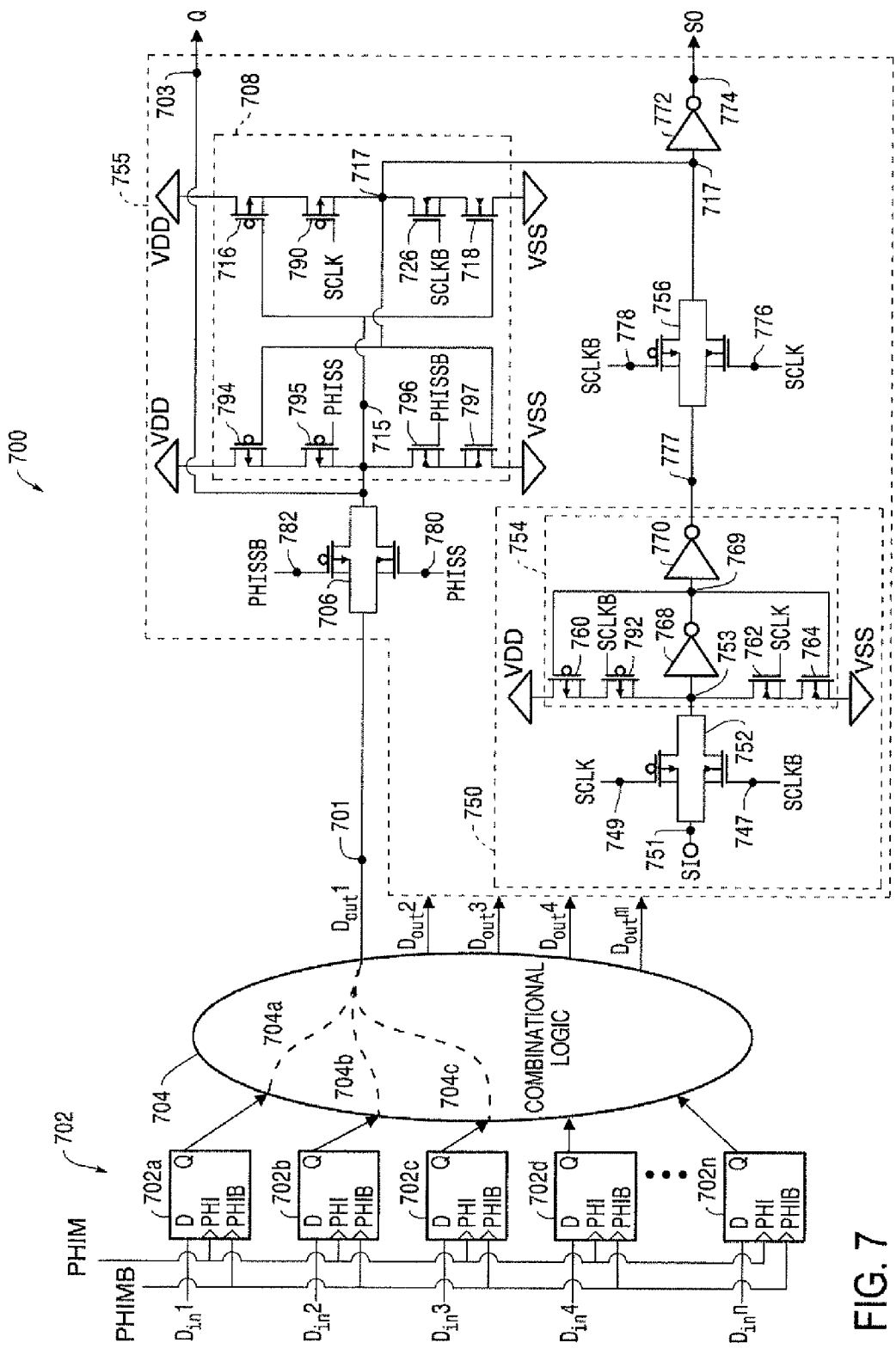
FIG. 7 shows the exemplary portion of the semiconductor integrated circuit (IC) combinational logic circuit of FIG. 4 in which the slave output latch circuit is configured for use with an internal scan chain using a second embodiment of a fully clocked non-fighting scan latch.

FIG. 7 shows a second embodiment of the non-fighting slave output scan latch described above with respect to FIG. 6. Using a plurality of such non-fighting slave output scan latches to form a scan array, the combinational logic included in logic circuit 704 may be tested in a manner similar to that described above with respect to FIG. 1.

Features in FIG. 7, similar to those described earlier with respect to FIG. 6, have been identified with like numerals. For example, a feature in FIG. 7 corresponding to a like feature described with respect to FIG. 6 will be identified with a number that retains the last two digits of the numeric identifier of the object described with respect to FIG. 6. Unless otherwise indicated, the features and operational function of like numbered objects remain identical to those described above with respect to FIG. 6 and therefore are not addressed in further detail with respect to FIG. 7.

In the embodiment of a non-fighting slave output scan latch 755 shown in FIG. 7, the output of scan control circuit 750 may be connected, via scan data pass-through switch 756 directly to the input of output inverter 772 at node 717, rather than the input of output storage circuit 708 at node 715. Further output storage circuit 708 may differ significantly from output storage circuit 608 described above with respect to FIG. 6. For example, output storage circuit 708 may include p-type transistor 794, p-type transistor 795, p-type transistor 716, p-type transistor 790, n-type transistor 796, n-type transistor 797, n-type transistor 726, and n-type transistor 718.

One of a source and a drain of p-type transistor 794 may be connected to a HIGH voltage source, VDD, the other of the source and the drain of p-type transistor 794 may be connected to one of a source and a drain of p-type transistor 795, and the other of the source and the drain of p-type transistor 795 may be connected to node 715. One of a source and a drain of n-type transistor 797 may be connected to a LOW voltage source, VSS, the other of the source and the drain of n-type transistor 797 may be connected to one of a source and a drain of n-type transistor 796, and the other of the source and the drain of n-type transistor 796 may be connected to node 715. The gate of p-type transistor 794 and the gate of n-type transistor 797 may be connected to node 717, the gate of n-type transistor 796 may be connected to a lead fed by inverted slave phase clock signal PHISSB, the gate of p-type transistor 795 may be connected to a lead fed by slave phase clock signal PHISS.

One of a source and a drain of n-type transistor 718 may be connected to a LOW voltage source, VSS, the other of the source and the drain of n-type transistor 718 may be connected to one of a source and a drain of n-type transistor 726, and the other of the source and the drain of n-type transistor 726 may be connected to node 717. One of a source and a drain of p-type transistor 716 may be connected to a HIGH voltage source, VDD, the other of the source and the drain of p-type transistor 716 may be connected to one of a source and a drain of p-type transistor 790, and the other of the source and the drain of p-type transistor 790 may be connected to node 717. The gate of p-type transistor 716 and the gate of n-type transistor 718 may be connected to node 715, the gate of n-type transistor 726 may be connected to a lead fed by inverted slave scan clock signal SCLKB, the gate of p-type transistor 790 may be connected to a lead fed by slave scan clock signal SCLK.

Operation of the non-fighting slave output scan latch 755 of FIG. 7 in scan mode is described below with respect to FIG. 8. Operation of the non-fighting slave output scan latch 755 of FIG. 7 in data mode is described below with respect to FIG. 9. Non-fighting slave output scan latch 755 supports the storage of data in data mode and scan mode in a manner similar to that used by non-fighting slave output scan latch 655, described above with respect to FIG. 6 and, therefore, may be used as a function replacement for non-fighting slave output scan latch 655. However, because fully-clocked non-fighting slave output scan latch 755 is non-fighting, regardless of the data value placed at node 715, and because non-fighting slave output scan latch 755 includes no more than 2 transistors in series in output storage circuit 708, as opposed to the 3 transistors in series used by output storage circuit 608 of non-fighting slave output scan latch 655, non-fighting slave output scan latch 755 may be used in circuits in which combination logic circuit 704 provide less driving power than that required in circuits that use non-fighting slave output scan latch 655. Further, since the output of scan control circuit 750 is connected, via scan data pass-through switch 756 directly to the input of output inverter 772 at node 717, rather than the input of output storage circuit 708 at node 715, node 703 has the same load as it would have without the scan structure. This makes the speed through non-fighting slave output scan latch 755 the same as that for a non-scanable latch and, therefore, comparatively faster than the fully clocked version of original scan latch shown in FIG. 6.

Because non-fighting slave output scan latch 755 requires less driving power, non-fighting slave output scan latch 755 may be used in a wider range of circuits. Although one can ensure sufficient drive strength for the N-type transistor stack driving the input D for a particular value of supply voltage, temperature or process corner, it may not be possible to satisfy this condition over wide variations of these parameters. The variation of these parameters can ensue from various reasons, such as fabrication of a circuit at different foundries or reuse of the designed circuit for several product lines some of which might require high speed operations while others might emphasize low power operation. Therefore, because non-fighting slave output scan latch 755 requires less driving power, non-fighting slave output scan latch 755 may be used successfully is a wider range of circuits than the circuit described above with respect to FIG. 5.

In non-fighting slave output scan latch 755, no transistor stack includes more than 2 transistors in series. Large stacks of transistors, e.g., transistor stacks with more than 2 transistors, can be problematic especially when operating the latch with a low supply voltage. Each transistor within the respective stacks has a threshold voltage (Vt) associated with it, below which the transistor cannot turn on. Even when a transistor is fully on, there is a small voltage difference between its source and drain node, which can be denoted by symbol $\Delta V$. Both Vt and $\Delta V$ are functions of the length of transistor, width of transistor, temperature of operation and the type of transistor. Thus the combination of supply voltage, Vt, $\Delta V$ and transistor type limits the number of transistors a circuit can have in a series stack. Normally a CMOS transistor is fabricated with three levels of threshold voltage (Vt): standard Vt (SVT), high-Vt(HVT) and low-Vt(LVT). Of the three types the Vt of HVT is the highest and that of LVT is the lowest for comparable size transistors. Also the LVT is the fastest and HVT is slowest among the three types, and the LVT has the highest leakage current and HVT has the lowest leakage current.

Latch designs which have increased number of transistors in their respective transistor stacks operate best at higher temperatures. For example, a low supply voltage and HVT combination is usually used for low power applications. However, use of a latch design with a large number of transistors in its transfer stacks in a circuit that uses a low supply voltage and HVT transistor technology combination may experience problems due to increases in the combined threshold voltage of the series transistors in the respective transistor stacks as the operating temperature in which the circuit is used decreases. Therefore, a fully clocked scan latch, such as non-fighting slave output scan latch 755 described above with respect to FIG. 7, that avoids fighting and that has no more than two transistors in any of its respective transistor stacks, represents an alternative design that may be operated successfully when implemented using a greater number of supply voltage, threshold voltage, source-to-drain voltage, and transistor technology combinations.

Figure 8:
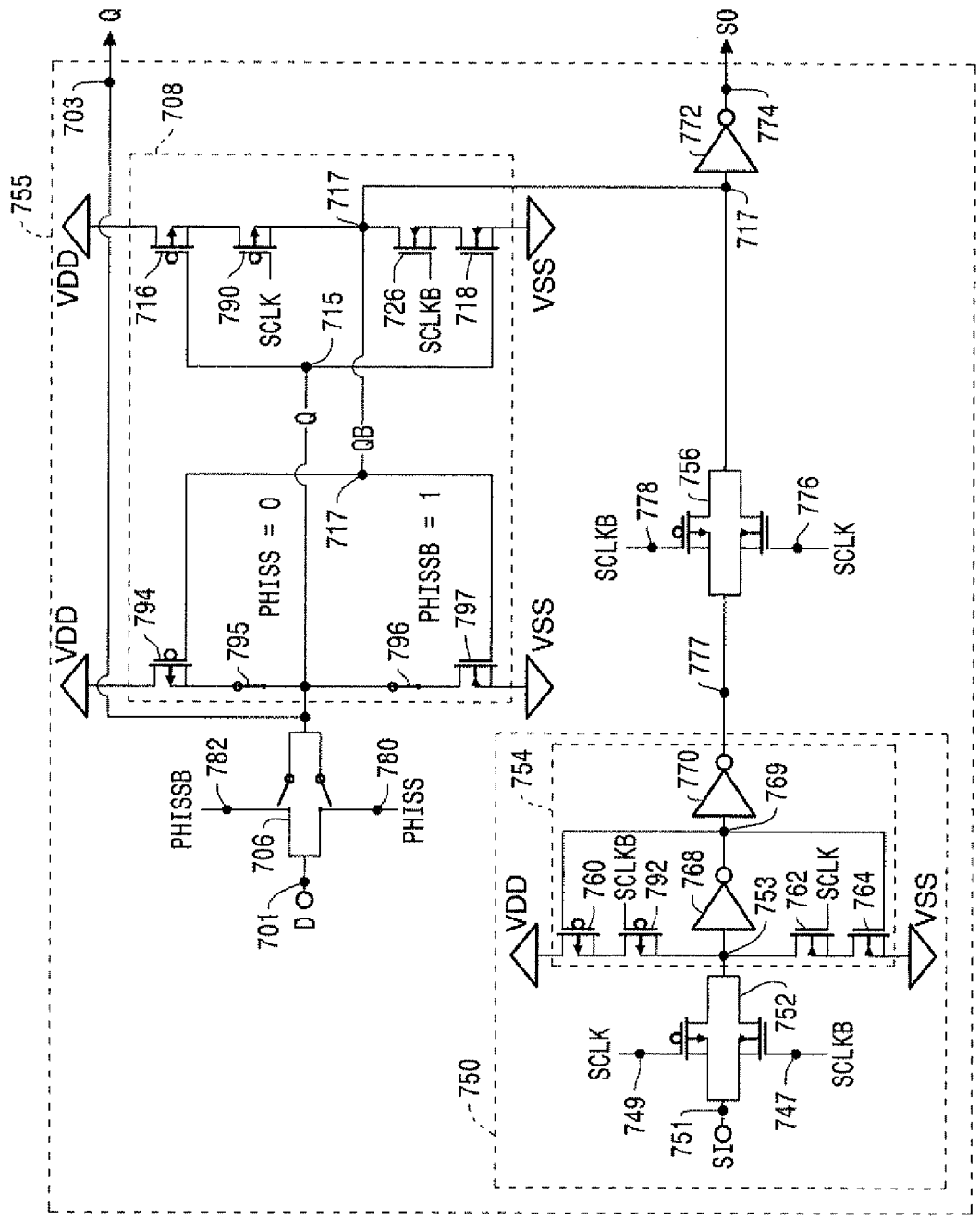
FIG. 8 shows, in isolation, an equivalent circuit of the fully clocked non-fighting scan latch of FIG. 7 configured for use in scan mode.

FIG. 8 shows, in isolation, an equivalent circuit of the fully clocked scan latch of FIG. 7 configured for use in scan mode. Features in FIG. 8, similar to those described earlier with respect to FIG. 7, have been identified with like numerals. Unless otherwise indicated, the features and operational function of like numbered objects remain identical to those described above with respect to FIG. 7 and therefore are not addressed in further detail with respect to FIG. 7.

As graphically depicted in the equivalent circuit diagram shown in FIG. 8, in operation during scan mode, inverted slave phase clock signal PHISSB is held HIGH and slave phase clock signal PHISS is held LOW, so logic data pass-through switch 706 is fixed OPEN, effectively disconnecting combination logic circuit 704 from non-fighting slave output scan latch 755, and p-type transistor 795 and n-type transistor 796 are held CLOSED.

During operation, a data bit is passed from node 777 to node 717 by scan data pass-through switch 756 when inverted slave scan clock signal SCLKB is LOW and slave scan clock signal SCLK is HIGH. Therefore, node 717 is isolated from HIGH voltage source VDD by p-type transistor 790, which is OPEN, and node 717 is isolated from LOW voltage source VSS by n-type transistor 726, which is OPEN and the data bit is passed from node 777 to node 717 by scan data pass-through switch 756 without fighting.

If the bit passed to node 717 is LOW, p-type transistor 794 is CLOSED and n-type transistor 797 is OPEN, therefore, p-type transistor 716 is OPEN and n-type transistor 718 is closed. In the next half-clock cycle when inverted slave scan clock signal SCLKB changes to HIGH and slave scan clock signal SCLK changes to LOW, p-type transistor 790 is CLOSED and n-type transistor 726 is also CLOSED. Therefore, the LOW value passed to node 717 is maintained by a connection through n-type transistor 726 and n-type transistor 718 to LOW voltage source VSS. Maintaining a LOW value passed at node 717, results in a HIGH value being maintained at node 774.

If the bit passed to node 717 is HIGH, p-type transistor 794 OPEN and n-type transistor 797 is CLOSED, therefore, p-type transistor 716 is CLOSED and n-type transistor 718 is OPEN. In the next half-clock cycle when inverted slave scan clock signal SCLKB changes to HIGH and slave scan clock signal SCLK changes to LOW, p-type transistor is closed and n-type transistor 726 is also CLOSED. Therefore, the HIGH value passed to node 717 is maintained by a connection through p-type transistor 790 and p-type transistor 716 to HIGH voltage source VDD. Maintaining a HIGH value passed at node 717, results in a LOW value being maintained at node 774.

Figure 9:
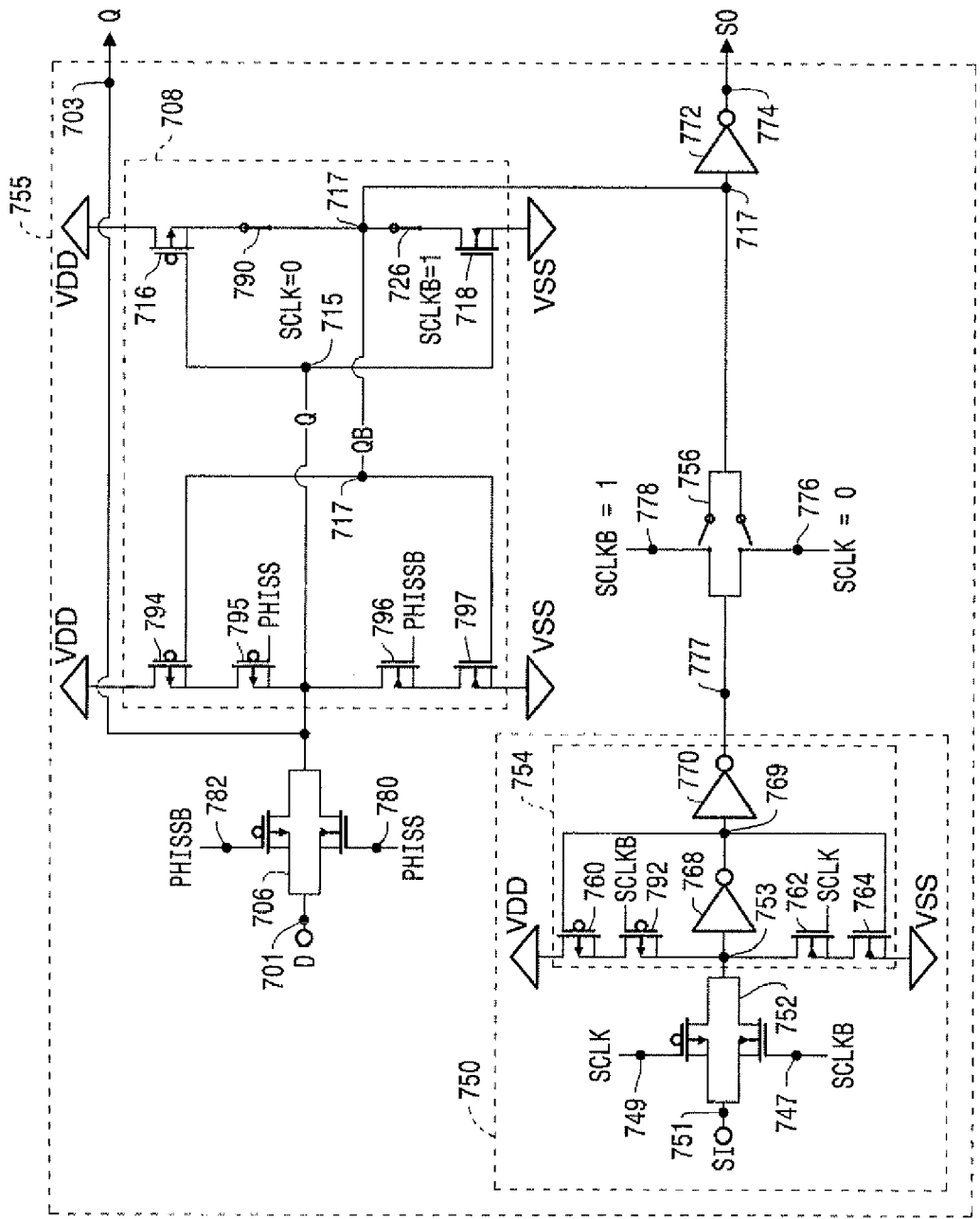
FIG. 9 shows, in isolation, an equivalent circuit of the fully clocked non-fighting scan latch of FIG. 7 configured for use in data mode.

FIG. 9 shows, in isolation, an equivalent circuit of the fully clocked scan latch of FIG. 7 configured for use in data mode. Features in FIG. 9, similar to those described earlier with respect to FIG. 7, have been identified with like numerals. Unless otherwise indicated, the features and operational function of like numbered objects remain identical to those described above with respect to FIG. 7 and therefore are not addressed in further detail with respect to FIG. 9.

As graphically depicted in the equivalent circuit diagram shown in FIG. 9, in operation during data mode, inverted slave scan clock signal SCLKB is held HIGH and slave scan clock signal SCLK is held LOW, so scan pass-through switch 756 is fixed OPEN, effectively disconnecting output of scan control circuit 750 from non-fighting slave output scan latch 755, and p-type transistor 790 and n-type transistor 726 are held CLOSED.

During operation, a data bit is passed from node 701 to node 715 by logic data pass-through switch 706 when inverted slave phase clock signal PHISSB is LOW and slave phase clock signal PHISS is HIGH. Therefore, node 715 is isolated from HIGH voltage source VDD by p-type transistor 795, which is OPEN, and node 715 is isolated from LOW voltage source VSS by n-type transistor 796, which is OPEN and the data bit is passed from node 701 to node 715 by logic data pass-through switch 706 without fighting.

If the bit passed to node 715 is LOW, p-type transistor 716 is CLOSED and n-type transistor 718 is OPEN, therefore, p-type transistor 794 is OPEN and n-type transistor 797 is CLOSED. In the next half-clock cycle, inverted slave phase clock signal PHISSB changes to HIGH and slave phase clock signal PHISS changes to LOW, n-type transistor 796 is CLOSED and p-type transistor 795 is also CLOSED. Therefore, the LOW value passed to node 715 is maintained by a connection through n-type transistor 796 and n-type transistor 797 to LOW voltage source VSS. Maintaining a LOW value passed at node 715, results in a HIGH value being maintained at node 717, and a LOW value being maintained at node 774.

If the bit passed to node 715 is HIGH, p-type transistor 716 is OPEN and n-type transistor 718 is CLOSED, therefore, p-type transistor 794 is CLOSED and n-type transistor 797 is OPEN. In the next half-clock cycle, inverted slave phase clock signal PHISSB changes to HIGH and slave phase clock signal PHISS changes to LOW, n-type transistor 796 is CLOSED and p-type transistor 795 is also CLOSED. Therefore, the HIGH value passed to node 715 is maintained by a connection through p-type transistor 794 and p-type transistor 795 to HIGH voltage source VDD. Maintaining a HIGH value passed at node 715, results in a LOW value being maintained at node 717, and a HIGH value being maintained at node 774.

Figure 11:
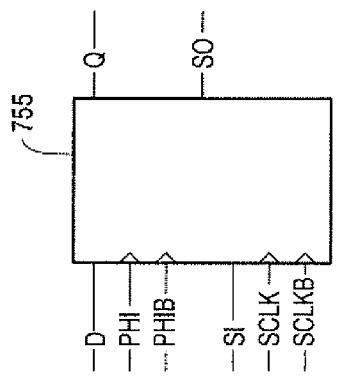
FIG. 11 shows an exemplary pin-out block representation of the fully clocked non-fighting scan latch shown in FIG. 10.
Figure 10:
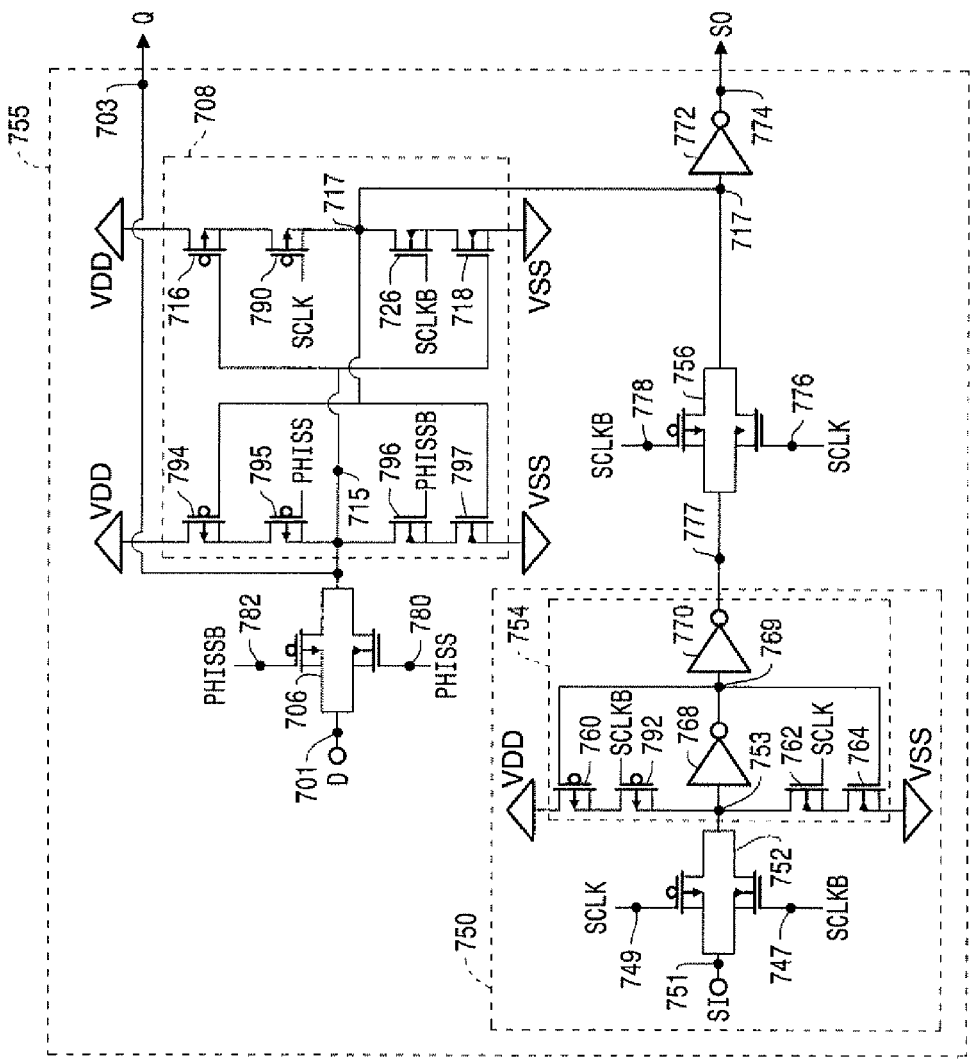
FIG. 10 shows, in isolation, the fully clocked non-fighting scan latch of FIG. 7.

FIG. 10 shows, in isolation, a non-fighting slave output scan latch 755 with a logic data pass-through switch 706, a modified storage circuit 708, and a scanning control circuit 750, a scan data pass-through switch 756, and an inverter 772, in isolation from any other circuitry. The combined circuitry may be referred to as a non-fighting slave output scan latch 755. FIG. 11 shows an exemplary pin-out block representation of non-fighting slave output scan latch 755. As shown in FIG. 11, the pin-out block representation of non-fighting slave output scan latch 755 may include input pins D, SI, PHISS, PHISSB, SCLK, SCLKB and output pins Q and SO. These input and output pins correspond with the input and output nodes described above with respect to FIG. 7 and FIG. 10. Specifically, input D represents node 701 in FIG. 7 which is connected to an output lead $D_{out}x$ of combinational logic 704; PHISS and PHISSB correspond to leads within FIG. 7 labeled as connected to one of inverted slave phase clock signal PHISSB and slave phase clock signal PHISS, respectively; output Q represents node 703 in FIG. 7 and FIG. 10 which presents a single binary output value output by combinational logic 704 on one of the respective one of output leads $D_{out}x$; and output SO represents node 774 in FIG. 7 and FIG. 10.

Figure 12:
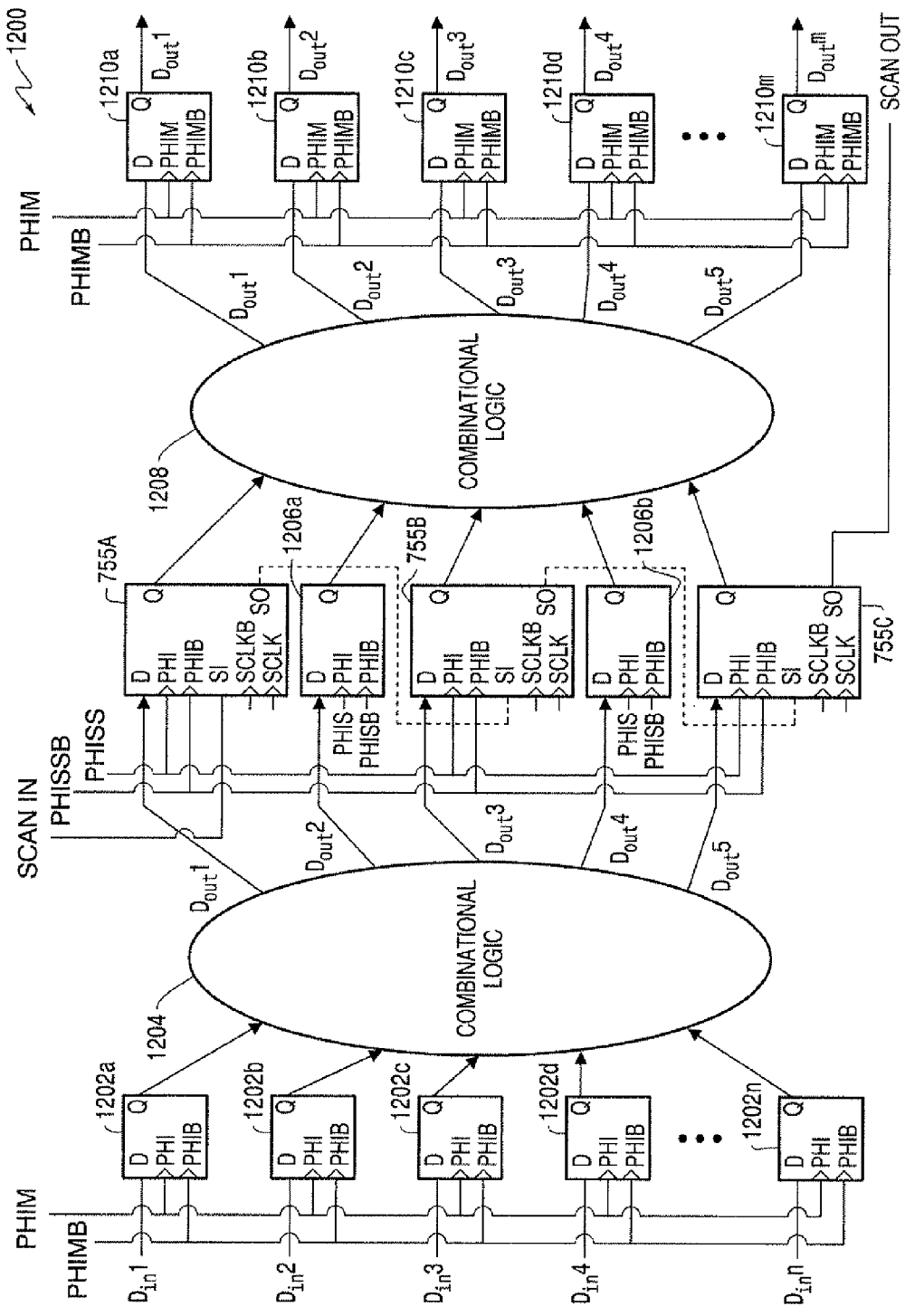
FIG. 12 shows an exemplary combinational logic scan chain that uses a plurality of the fully clocked non-fighting scan latch shown in FIG. 11 and the latch of FIG. 3.

FIG. 12 shows a portion of an exemplary combinational logic scan chain 1200 equipped with slave output latch circuits 1206a and 1206b that do not support scan based testing operations and non-fighting slave output scan latch 755A, non-fighting slave output scan latch 755B, and non-fighting slave output scan latch 755C that do support scan chain based testing.

The plurality of combinational logic circuits shown in FIG. 12 may represent only a portion of the total number of combinational logic circuits chained together and placed on an integrated circuit chip. For example, an exemplary combinational logic circuit 700 as described above with respect to FIG. 7, may be found in FIG. 12 and may include input line $D_{in}1$, master input latch 1202A, combinational logic 1204, output line $D_{out}1$, and non-fighting slave output scan latch 755A. Further, an exemplary combinational logic circuit 400 as described above with respect to FIG. 4, may be found in FIG. 12 and may include input line $D_{in}4$, master input latch 1202D, combinational logic 1204, output line $D_{out}4$, and slave output latch circuit 1206b.

The exemplary portion of a scan chain represented in FIG. 12 includes a total of three combinational logic circuits 700, as described above with respect to FIG. 7, and a total of two combinational logic circuit 400 as described above with respect to FIG. 4. It should be understood that number and type of combinational logic circuits included in FIG. 12 is exemplary only. Any number of combinational logic circuits may be arranged in any manner, e.g., in series, or in parallel, with other combinational logic circuits in the integrated circuit. For example, array of output latches 1210 may provide input data values to a subsequent combinational logic which may generate output data values, each stored in one of a slave output latch circuit that does not support scan based testing operations, e.g., such as latch 200 as described above with respect to FIG. 2, and a slave output latch circuit that does support scan based testing operations, e.g., non-fighting slave output scan latch 755, as described above with respect to FIG. 7. One such an exemplary integrated circuit may include any number of latches arranged in series, each latch separated from another latch by combinational logic, as shown in FIG. 12.

As shown in FIG. 12, a scan chain may be formed by the respective non-fighting scan-enabled slave output scan latches. For example, a first link in the scan chain may be formed by non-fighting slave output scan latch 755A, a second link in the scan chain may be formed by non-fighting slave output scan latch 755B, and a third link in the scan chain may be formed by non-fighting slave output scan latch 755C. The respective non-fighting scan-enabled slave output scan latches support functional operations as described above with respect to FIG. 6 through FIG. 7.

Figure 13:
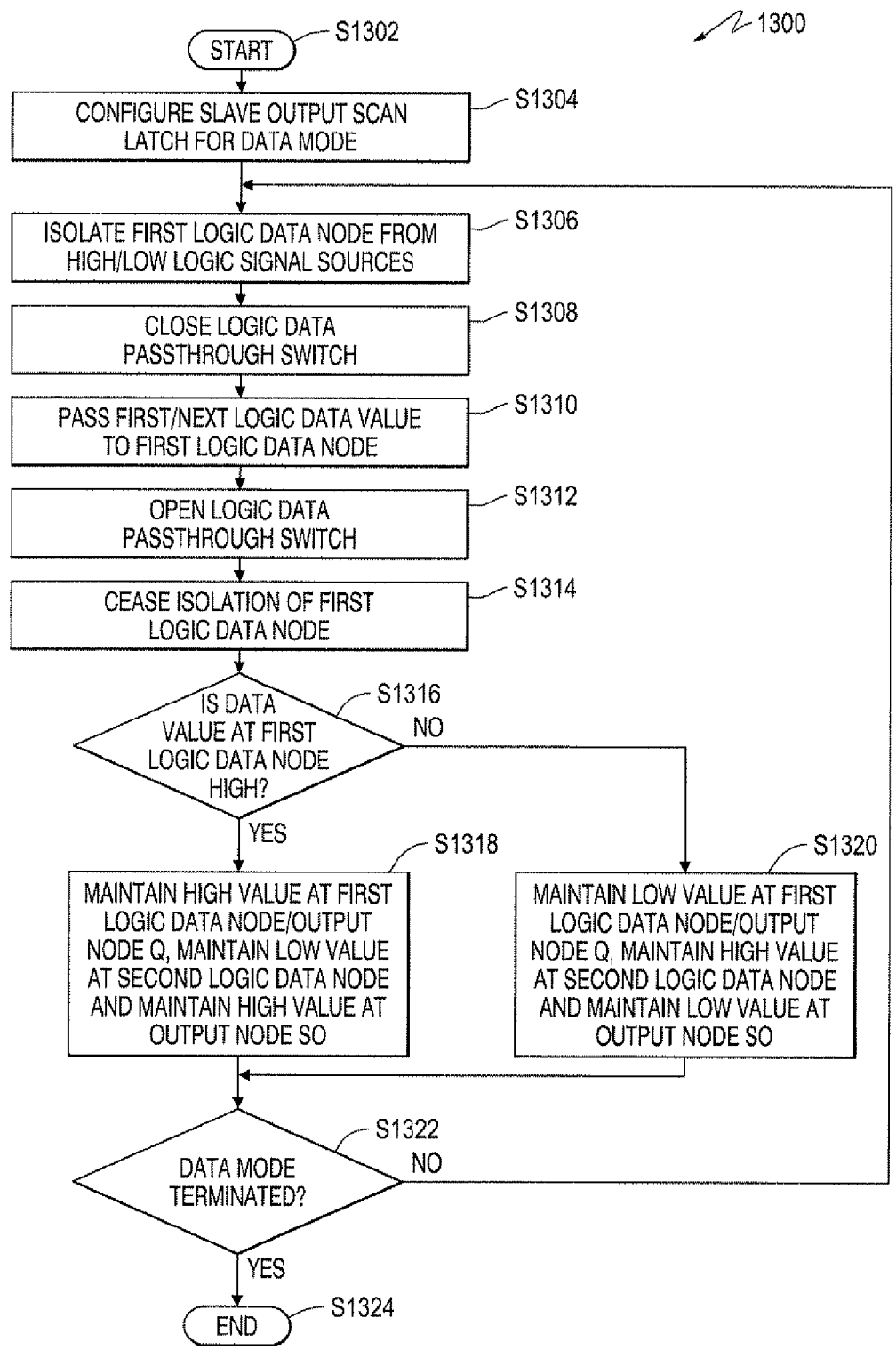
FIG. 13 is a flow-chart of an example process flow that may be performed by the fully clocked non-fighting scan latch of FIG. 7 operating in data mode.

FIG. 13 is a flow-chart of an example process flow that may be performed by the non-fighting slave output scan latch 755 described above with respect to FIG. 7 operating in data mode, as described above with respect to FIG. 9, and FIG. 14 is a flow-chart of an example process flow that may be performed by the non-fighting slave output scan latch 755 described above with respect to FIG. 7 operating in scan mode, as described above with respect to FIG. 8. In both FIG. 13 and FIG. 14 it is assumed that a controller associated with the combinational logic circuit in which multiple non-fighting slave output scan latches are included is capable of configuring the non-fighting slave output scan latches in one of a data mode and a scan mode, as described above with respect to FIG. 8 and FIG. 9, above. For example, a combinational logic circuit controller may configure the non-fighting slave output scan latches included in a combinational logic circuit in data mode by holding inverted scan clock signal SCLKB HIGH and holding scan clock signal SCLK LOW, thus effectively isolating each scan control circuit 750 from each non-fighting slave output scan latch 755 and fixing p-type transistor 790 and n-type transistor 726 in output storage circuit 708 CLOSED for the duration of the data mode. Further, the combinational logic circuit controller may configure the non-fighting slave output scan latches included in a combinational logic circuit in scan mode by holding inverted slave phase clock signal PHISSB HIGH and holding slave phase clock signal PHISS LOW, thus effectively isolating each non-fighting slave output scan latch 755 from its respective combinational logic circuit output $D_{out}x$ and fixing p-type transistor 795 and n-type transistor 796 in output storage circuit 708 CLOSED for the duration of the scan mode. As shown in FIG. 13, operation of process 1300 begins at S1302 and proceeds to S1304.

At S1304, a combinational logic circuit controller may configure each non-fighting slave output scan latch 755 in a selected scan chain of a combinational logic circuit to operate in data mode, and operation of the process continues at S1306.

At S1306, first logic data node 715 may be isolated from HIGH signal source VDD and LOW signal source VSS based on a first half-cycle the slave phase clock signal in which inverted slave phase clock signal PHISSB is LOW and slave phase clock signal PHISS is HIGH, and operation of the process continues at S1308.

At S1308, logic data pass-through switch 706 is CLOSED, based on the same half-cycle of the slave phase clock signal in which inverted slave phase clock signal PHISSB is LOW and slave phase clock signal PHISS is HIGH, at S1306, and operation of the process continues at S1310.

At S1310, based on the same half-cycle of the slave phase clock signal in which inverted slave phase clock signal PHISSB is LOW and slave phase clock signal PHISS is HIGH, at S1306 and at S1308, a first/next logic data value is passed from a combinational logic output, e.g., at node 701, to first logic data node 715, and operation of the process continues at S1312.

At S1312, based on a next half-cycle of the slave phase clock signal in which inverted slave phase clock signal PHISSB is HIGH and slave phase clock signal PHISS is LOW, logic data pass-through switch 706 is OPENED, and operation of the process continues at S1314.

At S1314, based on the same half-cycle of the slave phase clock signal in which inverted slave phase clock signal PHISSB is HIGH and slave phase clock signal PHISS is LOW, at S1312, first logic data node 715 is no longer isolated from HIGH signal source VDD and LOW signal source VSS, i.e., p-type transistor 795 and n-type transistor 796 are both CLOSED, and operation of the process continues at S1316.

At S1316, based on the same half-cycle of the slave phase clock signal in which inverted slave phase clock signal PHISSB is HIGH and slave phase clock signal PHISS is LOW, at S1312 and at S1314, the value of the logic data value passed to logic data node 715 is maintained, as described below at S1318 and at S1320.

At S1318, if the logic data value passed to first logic data node 715 is HIGH, a HIGH logic data value is maintained at first logic data node 715 and therefore at output node Q, a LOW logic data value is maintained at second logic data node 717, and a HIGH logic data value is maintained at output node SO, as described above with respect to operation of the circuit in data mode with respect to FIG. 9, and operation of the process continues at S1322.

At S1320, if the logic data value passed to first logic data node 715 is LOW, a LOW logic data value is maintained at first logic data node 715 and therefore at output node Q, a HIGH logic data value is maintained at second logic data node 717, and a LOW logic data value is maintained at output node SO, as described above with respect to operation of the circuit in data mode with respect to FIG. 9, and operation of the process continues at S1322.

If, at S1322, the combinational logic circuit controller terminates data mode, operation of the process terminates at S1324, otherwise, operation of the process continues at S1306.

Figure 14:
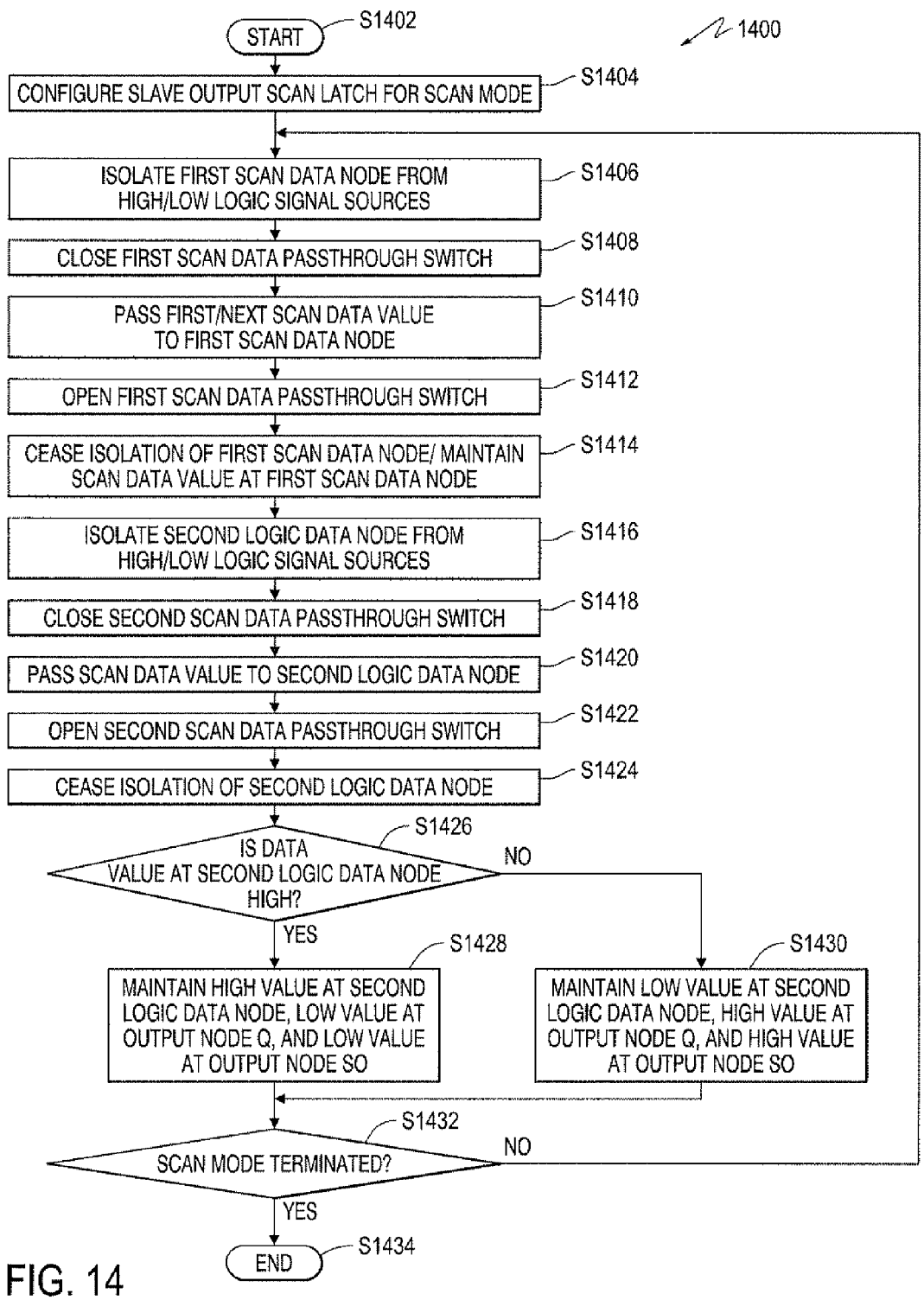
FIG. 14 is a flow-chart of an example process flow that may be performed by fully clocked non-fighting scan latch of FIG. 7 operating in scan mode.

FIG. 14 is a flow-chart of an example process flow that may be performed by the non-fighting slave output scan latch 755 described above with respect to FIG. 7 operating in scan mode, as described above with respect to FIG. 8. As shown in FIG. 14, operation of process 1400 begins at S1402 and proceeds to S1404.

At S1404, a combinational logic circuit controller may configure each non-fighting slave output scan latch 755 in a selected scan chain of a combinational logic circuit to operate in scan mode, and operation of the process continues at S1406.

At S1406, first scan data node 753 may be isolated from HIGH signal source VDD and LOW signal source VSS based on a first half-cycle of the scan clock signal in which inverted scan clock signal SCLKB is HIGH and scan clock signal SCLK is LOW, and operation of the process continues at S1408.

At S1408, first scan data pass-through switch 752 is CLOSED, based on the same half-cycle of the scan clock signal in which inverted scan clock signal SCLKB is HIGH and scan clock signal SCLK is LOW, as at S1406, and operation of the process continues at S1410.

At S1410, based on the same half-cycle of the scan clock signal in which inverted scan clock signal SCLKB is HIGH and scan clock signal SCLK is LOW, as at S1406 and at S1408, a first/next scan data value is passed from a scan data source, e.g., at node 751, to first scan data node 753, and operation of the process continues at S1412.

At S1412, based on a next half-cycle of the scan clock signal in which inverted scan clock signal SCLKB is LOW and scan clock signal SCLK is HIGH, first scan data pass-through switch 752 is OPENED, and operation of the process continues at S1414.

At S1414, based on the same half-cycle of the scan clock signal in which inverted scan clock signal SCLKB is LOW and scan clock signal SCLK is HIGH, at S1412, first scan data node 753 is no longer isolated from HIGH signal source VDD and LOW signal source VSS, i.e., p-type transistor 792 and n-type transistor 762 are both CLOSED, the scan data value is maintained at node 753 as described above with respect to FIG. 8, and operation of the process continues at S1416.

At S1416, second logic data node 717 may be isolated from HIGH signal source VDD and LOW signal source VSS, based on the same half-cycle of the scan clock signal in which inverted scan clock signal SCLKB is LOW and scan clock signal SCLK is HIGH, at S1412 and at S1414, and operation of the process continues at S1418.

At S1418, second scan data pass-through switch 756 is CLOSED, based on the same half-cycle of the scan clock signal in which inverted scan clock signal SCLKB is LOW and scan clock signal SCLK is HIGH, as at S1412 through S1416, and operation of the process continues at S1420.

At S1420, based on the same half-cycle of the scan clock signal in which inverted scan clock signal SCLKB is LOW and scan clock signal SCLK is HIGH, as at S1412 through S1418, a first/next scan data value is passed from a second scan data node, e.g., at node 777, to second logic data node 717, and operation of the process continues at S1422.

At S1422, based on a next half-cycle of the scan clock signal in which inverted scan clock signal SCLKB is HIGH and scan clock signal SCLK is LOW, second scan data pass-through switch 756 is OPENED, and operation of the process continues at S1424.

At S1424, based on the same half-cycle of the scan clock signal in which inverted scan clock signal SCLKB is HIGH and scan clock signal SCLK is LOW, at S1422, second logic data node 717 is no longer isolated from HIGH signal source VDD and LOW signal source VSS, i.e., p-type transistor 790 and n-type transistor 726 are both CLOSED, and operation of the process continues at S1426.

At S1426, based on the same half-cycle of the scan clock signal in which inverted scan clock signal SCLKB is HIGH and scan clock signal SCLK is LOW, at S1422 and at S1424, the value of the scan data value passed to second logic data node 717 is maintained, as described below at S1428 and at S1430.

At S1428, if the scan data value passed to second logic data node 717 is HIGH, a HIGH logic data value is maintained at second logic data node 717, a LOW logic data value is maintained at output node Q, and a LOW logic data value is maintained at output node SO, as described above with respect to operation of the circuit in scan mode with respect to FIG. 8, and operation of the process continues at S1432.

At S1430, if the scan data value passed to second logic data node 717 is LOW, a LOW logic data value is maintained at second logic data node 717, a HIGH logic data value is maintained at output node Q, and a HIGH logic data value is maintained at output node SO, as described above with respect to operation of the circuit in scan mode with respect to FIG. 8, and operation of the process continues at S1432.

If, at S1432, the combinational logic circuit controller terminates scan mode, operation of the process terminates at S1434, otherwise, operation of the process continues at S1406.

It is noted that in the claims, below, the recited elements are described in detail at least with respect to FIG. 6 and FIG. 7, above. Specifically, references to "logic data output storage circuit" are reference to output storage circuit 708; references to "logic data pass-through switch" are references to logic data pass-through switch 706; references to "first data latch node" are references to node 715; and references to "second data latch node" are references to node 717. Further, it is noted that, in the claims below, references to "scan data output storage circuit" are references to output storage circuit 754; references to "first scan data pass-through switch" are references to scan data pass-through switch 752; references to "second scan data pass-through switch" are references to scan data pass-through switch 756; references to "first scan latch node" are references to node 753; and references to "second scan latch node" are references to node 777.

For purposes of explanation, in the above description, numerous specific details are set forth in order to provide a thorough understanding of the non-fighting scan-enabled slave output scan latch to support scan chain testing of combinational logic circuits. It will be apparent, however, to one skilled in the art that the non-fighting scan-enabled slave output scan latch may be practiced without these specific details. In other instances, well-known structures and devices are shown in block diagram form in order to avoid obscuring the features of the non-fighting scan-enabled slave output scan latch.

While the non-fighting scan-enabled slave output scan latch has been described in conjunction with the specific embodiments thereof, it is evident that many alternatives, modifications, and variations will be apparent to those skilled in the art. Accordingly, embodiments of the non-fighting scan-enabled slave output scan latch as set forth herein are intended to be illustrative, not limiting. There are changes that may be made without departing from the spirit and scope of the invention.

What is claimed is:

1. A scan latch comprising:
   a logic data output storage circuit comprising:
      a first transistor that controls a connection between a first data latch node of the logic data output storage circuit and a LOW logic signal source based on a slave phase clock signal of a two-phase clock; and
      a second transistor that controls a connection between a second data latch node of the logic data output storage circuit and the LOW logic signal source based on a scan clock signal;
   a logic data pass-through switch that controls entry of a logic data from a combinational logic circuit to the first data latch node based on the slave phase clock signal;
   a scan data output storage circuit comprising:
      a first transistor that controls a connection between a first scan latch node of the scan data output storage circuit and a LOW logic signal source based on the scan clock signal;
   a first scan data pass-through switch that controls entry of a scan data from a scan data source to the first scan latch node based on the scan clock signal; and
   a second scan data pass-through switch that controls passage of the scan data from a second scan latch node to the second data latch node based on the scan clock signal.

2. The scan latch of claim 1, logic data output storage circuit further comprising:
   a third transistor that controls a connection between the first data latch node of the logic data output storage circuit and a HIGH logic signal source based on the slave phase clock signal; and a fourth transistor that controls a connection between the second data latch node of the logic data output storage circuit and the HIGH logic signal source based on the scan clock signal.

3. The scan latch of claim 1, logic data output storage circuit further comprising:
  a fifth transistor that controls a connection between the first data latch node of the logic data output storage circuit and a HIGH logic signal source based on a data value stored at the second data latch node of the logic data output storage circuit; and
  a sixth transistor that controls a connection between the first data latch node of the logic data output storage circuit and the LOW logic signal source based on the data value stored at the second data latch node of the logic data output storage circuit.

4. The scan latch of claim 1, logic data output storage circuit further comprising:
  a seventh transistor that controls a connection between the second data latch node of the logic data output storage circuit and a HIGH logic signal source based on a data value stored at the first data latch node of the logic data output storage circuit; and
  an eighth transistor that controls a connection between the second data latch node of the logic data output storage circuit and the LOW logic signal source based on the data value stored at the first data latch node of the logic data output storage circuit.

5. The scan latch of claim 1, the scan data output storage circuit further comprising:
  a second transistor that controls a connection between the first scan latch node of the scan data output storage circuit and a HIGH logic signal source based on the scan clock signal.

6. The scan latch of claim 1, the scan data output storage circuit further comprising:
  a third transistor that controls a connection between the first scan latch node of the scan data output storage circuit and a HIGH logic signal source based on a data value stored at a third data latch node of the scan data output storage circuit; and
  a fourth transistor that controls a connection between the first scan latch node of the scan data output storage circuit and the LOW logic signal source based on a data value stored at the third data latch node of the scan data output storage circuit.

7. The scan latch of claim 1, further comprising:
  an inverter that inverts the data at the second data latch node of the logic data output storage circuit.

8. The scan latch of claim 1, wherein no transistor stack within the logic data output storage circuit located between one of the first data latch node and the HIGH logic signal source, the first data latch node and the LOW logic signal source, the second data latch node and a HIGH logic signal source, the second data latch node and the LOW logic signal source, includes more than two transistors connected in series.

9. The scan latch of claim 1, wherein no more than two transistors are connected in series between the LOW logic signal source and the first data latch node of the logic data output storage circuit.

10. The scan latch of claim 1, wherein no more than two transistors are connected in series between a HIGH logic signal source and the first data latch node of the logic data output storage circuit.

11. The scan latch of claim 1, wherein no more than two transistors are connected in series between the LOW logic signal source and the second data latch node of the logic data output storage circuit.

12. The scan latch of claim 1, wherein no more than two transistors are connected in series between a HIGH logic signal source and the second data latch node of the logic data output storage circuit.

13. The scan latch of claim 1, wherein no more than two transistors are connected in series between the LOW logic signal source and the first scan latch node of the scan data output storage circuit.

14. The scan latch of claim 1, wherein no more than two transistors are connected in series between a HIGH logic signal source and the first scan latch node of the scan data output storage circuit.

15. A scan latch comprising:
  a logic data pass-through switch that controls entry of a logic data from a combinational logic circuit to a first data latch node of the scan latch based on a slave phase clock signal of a two-phase clock; and
  a logic data output storage circuit comprising:
    a first transistor that controls a first portion of a connection between the first data latch node of the logic data output storage circuit and a LOW logic signal source based on the slave phase clock signal;
    a second transistor that controls a first portion of a connection between a second data latch node of the logic data output storage circuit and the LOW logic signal source based on a scan clock signal;
    a third transistor that controls a second portion of the connection between the first data latch node of the logic data output storage circuit and the LOW logic signal source based on the slave phase clock signal and a value of the logic data passed to the first data latch node; and
    a fourth transistor that controls a second portion of the connection between the second data latch node of the logic data output storage circuit and the LOW logic signal source based on the scan clock signal and the value of the logic data passed to the first data latch node.

16. The scan latch of claim 15, further comprising:
  a scan data output storage circuit comprising:
    a first transistor that controls a connection between a first scan data latch node of the scan data output storage circuit and the LOW logic signal source based on the scan clock signal;
  a first scan data pass-through switch that controls entry of a scan data from a scan data source to the first scan data latch node based on the scan clock signal; and
  a second scan data pass-through switch that controls passage of the scan data from a second scan data latch node to the second data latch node based on the scan clock signal.

17. A method of controlling a scan latch, comprising:
  isolating a first data latch node from a HIGH logic signal source and a LOW logic signal source based on a first clock phase of a slave phase clock signal of a two-phase clock;
  passing a logic data from a combinational logic circuit to the isolated first data latch node via a logic data pass-through switch based on the first clock phase of the slave phase clock signal of the two-phase clock; and maintaining the logic data stored at the first data latch node based on a second clock phase of the slave phase clock signal of the two-phase clock, a fixed value of a scan clock signal and a value of the logic data.

18. The method of claim 17, further comprising:
isolating a first scan latch node from one of a HIGH logic signal source and the LOW logic signal source based on a first clock phase of the scan clock signal;
passing a scan data from a scan data source to the isolated first scan latch node via a first scan data pass-through switch based on the first clock phase of the scan clock signal; and
maintaining the scan data stored at the first scan latch node based on a second clock phase of the scan clock signal and a value of the scan data.

19. The method of claim 18, further comprising:
isolating a second data latch node from the HIGH logic signal source and the LOW logic signal source based on the second clock phase of the scan clock signal; and
passing the scan data from a second scan latch node to the isolated second data latch node based on the second clock phase of the scan clock signal.

20. The method of claim 19, further comprising:
maintaining the scan data stored at the second data latch node based on a fixed value of the slave phase clock signal, the first clock phase of the scan clock signal and a value of the scan data.

\* \* \* \* \*